(12) United States Patent
Shiihara et al.

(10) Patent No.: US 12,185,011 B2
(45) Date of Patent: Dec. 31, 2024

(54) SOLID-STATE IMAGING DEVICE, PIXEL DRIVING METHOD, AND ELECTRONIC APPARATUS

(71) Applicant: SONY SEMICONDUCTOR SOLUTIONS CORPORATION, Kanagawa (JP)

(72) Inventors: Yu Shiihara, Kanagawa (JP); Atsuhiko Yamamoto, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 138 days.

(21) Appl. No.: 17/998,555

(22) PCT Filed: May 10, 2021

(86) PCT No.: PCT/JP2021/017628
§ 371 (c)(1),
(2) Date: Nov. 11, 2022

(87) PCT Pub. No.: WO2021/241175
PCT Pub. Date: Dec. 2, 2021

(65) Prior Publication Data
US 2023/0209225 A1    Jun. 29, 2023

(30) Foreign Application Priority Data
May 27, 2020  (JP) ................. 2020-092163

(51) Int. Cl.
*H04N 25/78* (2023.01)
*H01L 27/146* (2006.01)
(Continued)

(52) U.S. Cl.
CPC ........... *H04N 25/78* (2023.01); *H04N 25/771* (2023.01); *H04N 25/79* (2023.01); *H01L 27/14623* (2013.01)

(58) Field of Classification Search
CPC ...... H04N 25/77; H04N 25/771; H04N 25/78; H01L 27/146; H01L 27/1461;
(Continued)

(56) References Cited

U.S. PATENT DOCUMENTS 10,072,974 B2   9/2018  Geurts
10,469,762 B2   11/2019 Kobayashi et al.
(Continued)

FOREIGN PATENT DOCUMENTS

JP    2001-057423    2/2001
JP    2013-098446    5/2013
(Continued)

OTHER PUBLICATIONS

International Search Report and Written Opinion prepared by the Japan Patent Office on Jul. 19, 2021, for International Application No. PCT/JP2021/017628, 3 pgs.

*Primary Examiner* — Anthony J Daniels
(74) *Attorney, Agent, or Firm* — SHERIDAN ROSS P.C.

(57) ABSTRACT

A solid-state imaging device includes a pixel array having a plurality of pixels. Each of the plurality of pixels includes a photoelectric conversion part embedded away from a substrate front surface of a semiconductor substrate, a memory part that holds a charge generated in the photoelectric conversion part, a first transfer transistor, a second transfer transistor, and a third transfer transistor connected in series between the photoelectric conversion part and the memory part, an accumulation part that accumulates the charge transferred from the memory part, and a light shielding part that covers a portion of the memory part facing a substrate rear surface side of the semiconductor substrate and has an opening between the photoelectric conversion part and the substrate front surface.

20 Claims, 32 Drawing Sheets

(51) Int. Cl.
  *H04N 25/771* (2023.01)
  *H04N 25/79* (2023.01)

(58) Field of Classification Search
  CPC ......... H01L 27/14612; H01L 27/14614; H01L 27/14623; H01L 27/14641
  USPC .................................................. 348/208.99
  See application file for complete search history.

(56) References Cited

U.S. PATENT DOCUMENTS

| | | | | |
|---|---|---|---|---|
| 2013/0215305 | A1* | 8/2013 | Yamashita | H01L 27/14609 348/301 |
| 2015/0084098 | A1 | 3/2015 | Choi et al. | |
| 2016/0056199 | A1* | 2/2016 | Kim | H04N 25/771 257/233 |
| 2016/0111461 | A1* | 4/2016 | Ahn | H04N 25/771 257/225 |
| 2017/0350755 | A1* | 12/2017 | Geurts | H04N 23/70 |
| 2018/0053803 | A1 | 2/2018 | Yoshita | |
| 2018/0288343 | A1* | 10/2018 | McCarten | H04N 25/531 |
| 2019/0222811 | A1 | 7/2019 | Yamaguchi | |
| 2020/0045250 | A1 | 2/2020 | Geurts | |
| 2020/0105816 | A1* | 4/2020 | Chung | H01L 27/14603 |

FOREIGN PATENT DOCUMENTS

| | | |
|---|---|---|
| JP | 2015-070272 | 4/2015 |
| JP | 2019-169501 | 10/2019 |
| JP | 2020-009883 | 1/2020 |
| JP | 2020-047616 | 3/2020 |
| WO | WO 2016/136486 | 9/2016 |
| WO | WO 2016/147901 | 9/2016 |
| WO | WO 2020/036054 | 2/2020 |

* cited by examiner

SOLID-STATE IMAGING DEVICE, PIXEL DRIVING METHOD, AND ELECTRONIC APPARATUS

CROSS REFERENCE TO RELATED APPLICATIONS

This application is a national stage application under 35 U.S.C. 371 and claims the benefit of PCT Application No. PCT/JP2021/017628, having an international filing date of 10 May 2021, which designated the United States, which PCT application claimed the benefit of Japanese Patent Application No. 2020-092163, filed 27 May 2020, the entire disclosures of each of which are incorporated herein by reference.

FIELD

The present disclosure relates to a solid-state imaging device, a pixel driving method, and an electronic apparatus.

BACKGROUND

For example, Patent Literature 1 discloses a method of providing a light shielding part to reduce light leakage to a memory part in a solid-state imaging device including a photoelectric conversion part and the memory part that temporarily holds charges accumulated in the photoelectric conversion part.

CITATION LIST

Patent Literature

Patent Literature 1: WO 2016/136486 A

SUMMARY

Technical Problem

In order to secure connection between a transfer transistor for transferring charges in a photoelectric conversion part to a memory part and the photoelectric conversion part, it is necessary to provide an opening in a light shielding part. It is desirable to arrange the memory part away from the opening. However, in this case, a distance between the photoelectric conversion part and the memory part increases to make it difficult to secure a potential gradient of the transfer transistor. When the distance between the photoelectric conversion part and the memory part is shortened in order to secure the potential gradient, light leakage to the memory part increases, and a parasitic light sensitivity (PLS) may deteriorate.

One aspect of the present disclosure is to suppress PLS deterioration.

Solution to Problem

A solid-state imaging device according to one aspect of the present disclosure includes a pixel array having a plurality of pixels, each of the plurality of pixels including: a photoelectric conversion part embedded away from a substrate front surface of a semiconductor substrate, a memory part that holds a charge generated in the photoelectric conversion part, a first transfer transistor, a second transfer transistor, and a third transfer transistor connected in series between the photoelectric conversion part and the memory part, an accumulation part that accumulates the charge transferred from the memory part, and a light shielding part that covers a portion of the memory part facing a substrate rear surface side of the semiconductor substrate, and has an opening between the photoelectric conversion part and the substrate front surface.

A pixel driving method according to one aspect of the present disclosure is a pixel driving method of driving a plurality of pixels, each of the plurality of pixels including: a photoelectric conversion part embedded away from a substrate front surface of a semiconductor substrate, a memory part that holds a charge generated in the photoelectric conversion part; a first transfer transistor, a second transfer transistor, and a third transfer transistor connected in series between the photoelectric conversion part and the memory part, an accumulation part that accumulates the charge transferred from the memory part, and a light shielding part that covers a portion of the memory part facing a substrate rear surface side of the semiconductor substrate, and has an opening between the photoelectric conversion part and the substrate front surface, the pixel driving method including: driving the first transfer transistor, the second transfer transistor, and the third transfer transistor so as to transfer the charge accumulated in the photoelectric conversion part to the memory part via the first transfer transistor, the second transfer transistor, and the third transfer transistor.

An electronic apparatus according to one aspect of the present disclosure is an electronic apparatus equipped with a solid-state imaging device including a pixel array having a plurality of pixels, each of the plurality of pixels including: a photoelectric conversion part embedded away from a substrate front surface of a semiconductor substrate, a memory part that holds a charge generated in the photoelectric conversion part, a first transfer transistor, a second transfer transistor, and a third transfer transistor connected in series between the photoelectric conversion part and the memory part, an accumulation part that accumulates the charge transferred from the memory part, and a light shielding part that covers a portion of the memory part facing a substrate rear surface side of the semiconductor substrate, and has an opening between the photoelectric conversion part and the substrate front surface.

DESCRIPTION OF EMBODIMENTS

Hereinafter, embodiments of the present disclosure will be described with reference to the drawings. In each of the following embodiments, same parts are given the same reference signs to omit redundant description.

Figure 1:
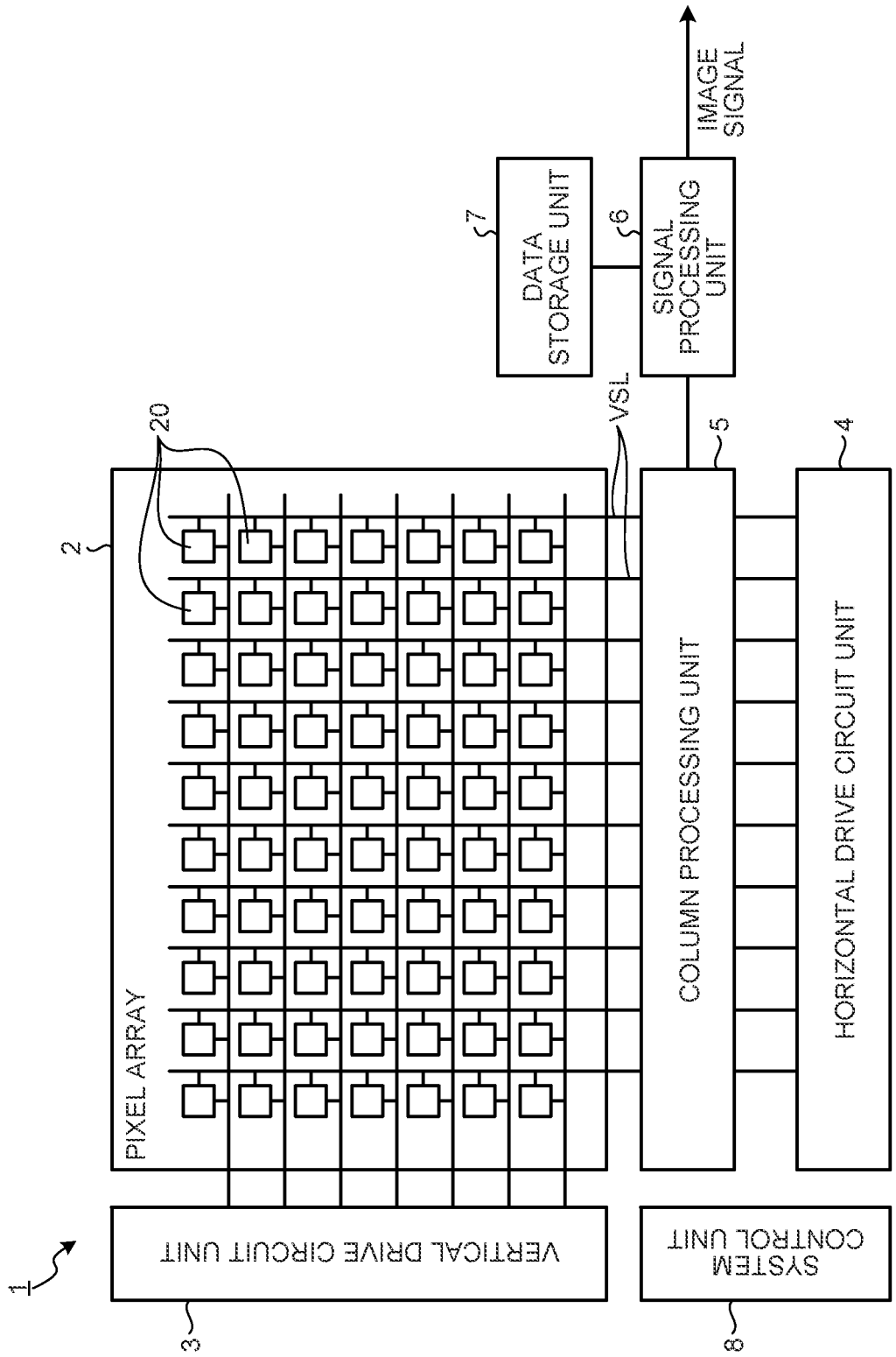
FIG. 1 is a diagram illustrating an example of a schematic configuration of a solid-state imaging device according to an embodiment.

The present disclosure will be described according to the following item order.
1. First Embodiment
2. Second Embodiment
3. Third Embodiment
4. Fourth Embodiment
5. Fifth Embodiment
6. Sixth Embodiment
7. Seventh Embodiment
8. Eighth Embodiment
9. Application example
10. Effects 1. First Embodiment FIG. 1 is a diagram illustrating an example of a schematic configuration of a solid-state imaging device according to an embodiment. A solid-state imaging device 1 is, for example, a complementary metal oxide semiconductor (CMOS) image sensor. The solid-state imaging device 1 is a solid-state imaging device of a global shutter type. In the global shutter type, exposure is performed in all pixels at the same start and end timings. The solid-state imaging device 1 may be a backside-illuminated solid-state imaging device.

The solid-state imaging device 1 illustrated in FIG. 1 includes a pixel array 2, a vertical drive circuit unit 3, a horizontal drive circuit unit 4, a column processing unit 5, a signal processing unit 6, a data storage unit 7, and a system control unit 8. These components are provided on a semiconductor substrate (e.g., silicon wafer or chip).

The pixel array 2 includes a plurality of pixels 20. The plurality of pixels 20 is arranged two-dimensionally. Details of the pixels 20 will be described later with reference to FIG. 2 and subsequent drawings.

The vertical drive circuit unit 3 drives the plurality of pixels 20 row by row by supplying a drive signal to each of the plurality of pixels 20. A pixel signal of the pixel 20 driven is held so as to appear in a vertical signal line VSL. The vertical drive circuit unit 3 is configured to include a shift register and an address decoder.

The horizontal drive circuit unit 4 drives (selects) the plurality of pixels 20 column by column by supplying a drive signal to each of the plurality of pixels 20. The pixel signal of the pixel 20 driven appears in the vertical signal line VSL, and is transmitted to the column processing unit 5 to perform processing. The horizontal drive circuit unit 4 is configured to include a register and an address decoder.

As described above, since the solid-state imaging device 1 is the solid-state imaging device of the global shutter type, the vertical drive circuit unit 3 and the horizontal drive circuit unit 4 are driven to achieve the same exposure period in the plurality of pixels 20.

The column processing unit 5 processes the pixel signal that appears in the vertical signal line VSL by driving the vertical drive circuit unit 3 and the horizontal drive circuit unit 4. An example of a main process is an AD conversion process. The pixel signal is acquired as a digital signal through the AD conversion process. A process of correlated double sampling (CDS) may also be performed. The column processing unit 5 may be provided with a unit circuit corresponding to each pixel column. The unit circuit is selected according to driving of the horizontal drive circuit unit 4.

The signal processing unit 6 generates an image signal by performing an arithmetic process or the like on the pixel signal acquired by the column processing unit 5. The signal processing unit 6 includes a logic circuit or the like that processes the digital signal.

The data storage unit 7 temporarily stores data necessary for processing or the like by the signal processing unit 6.

The system control unit 8 performs overall control of the solid-state imaging device 1. For example, the system control unit 8 controls drive timings of the vertical drive circuit unit 3 and the horizontal drive circuit unit 4, processing timings of the column processing unit 5 and the signal processing unit 6, and the like. The system control unit 8 is configured to include a timing generator.

Figure 2:
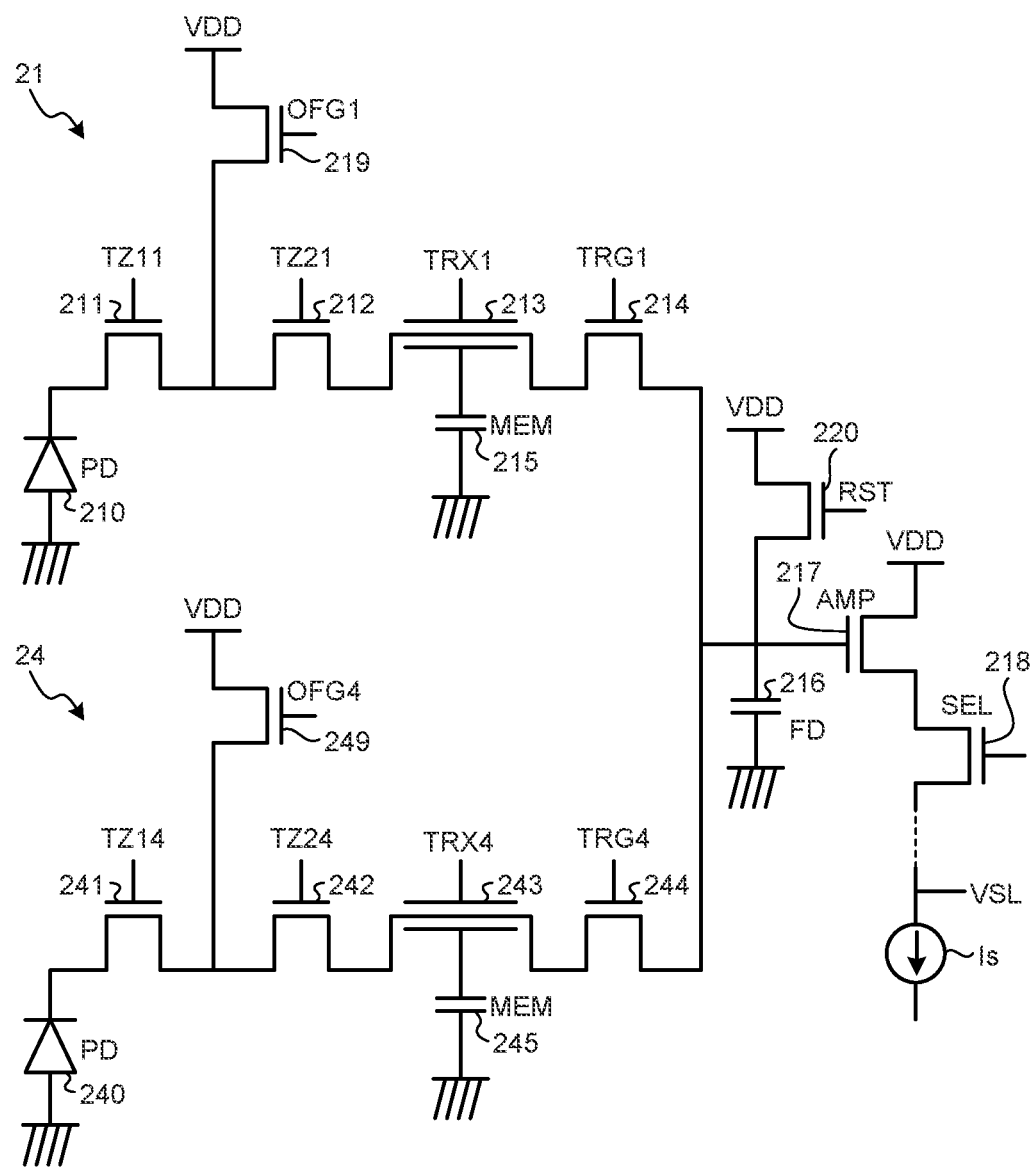
FIG. 2 is a diagram illustrating an example of a circuit configuration of a pixel.

FIG. 2 is a diagram illustrating an example of a circuit configuration of the pixel. FIG. 2 illustrates the circuit configuration of two pixels that are a pixel 21 and a pixel 24. As will be described later with reference to FIG. 3, the pixel 24 is a pixel three pixels next to the pixel 21.

The pixel 21 includes a PD 210, a first transfer transistor 211, a second transfer transistor 212, a third transfer transistor 213, a fourth transfer transistor 214, an MEM 215, an FD 216, an amplification transistor 217, a selection transistor 218, a discharge transistor 219, and a reset transistor 220.

The PD 210 is a photoelectric conversion part that generates and accumulates a charge corresponding to an amount of received light. The charge accumulated in the PD 210 is transferred to the MEM 215 by the first transfer transistor 211, the second transfer transistor 212, and the third transfer transistor 213 connected in series between the PD 210 and the MEM 215. The MEM 215 is connected to the PD 210 via the first transfer transistor 211, the second transfer transistor 212, and the third transfer transistor 213. The MEM 215 is a memory part that temporarily stores the charge transferred from the PD 210.

The charge retained in the MEM 215 is transferred to the FD 216 by the fourth transfer transistor 214. The FD 216 is a floating diffusion region that converts the charge transferred from the MEM 215 into an electric signal (voltage signal) and outputs the electric signal. This electric signal is read out by the amplification transistor 217 and output to the vertical signal line VSL via the selection transistor 218. In this example, a constant current source Is is connected to the vertical signal line VSL to configure a source follower circuit.

The discharge transistor 219 resets the PD 210 to a power supply VDD. In addition, a charge overflowing from the PD 210 is discharged to the power supply VDD. The reset transistor 220 resets the MEM 215 and the FD 216 to the power supply VDD.

The drive signal is applied to the transistors (gate in the example in FIG. 2) other than the amplification transistor 217. In the present disclosure, the drive signals applied to the first transfer transistor, the second transfer transistor, the third transfer transistor, the fourth transfer transistor, the selection transistor, the discharge transistor, and the reset transistor may be referred to as a drive signal TZ1, a drive signal TZ2, a drive signal TRX, a drive signal TRG, a drive signal SEL, a drive signal OFG, and a drive signal RST. Among these drive signals, to distinguish the drive signals applied to the transistors corresponding to the pixel 21 from those applied to the transistors corresponding to the pixel 24, the drive signals applied to the first transfer transistor 211, the second transfer transistor 212, the third transfer transistor 213, the fourth transfer transistor 214, and the discharge transistor 219 of the pixel 21 are referred to as a drive signal TZ11, a drive signal TZ21, a drive signal TRX1, a drive signal TRG1, and a drive signal OFG1. The vertical drive circuit unit 3 supplies the drive signal TZ11, the drive signal TZ21, the drive signal TRX1, the drive signal TRG1, the drive signal RST, and the drive signal OFG1 (FIG. 1). The horizontal drive circuit unit 4 supplies the drive signal SEL (FIG. 1).

The pixel 24 includes a PD 240, a first transfer transistor 241, a second transfer transistor 242, a third transfer transistor 243, a fourth transfer transistor 244, an MEM 245, and a discharge transistor 249. Furthermore, the pixel 24 shares the FD 216, the amplification transistor 217, the selection transistor 218, and the reset transistor 220 with the pixel 21. Since components of the pixel 24 are similar to corresponding components of the pixel 21, the description will not be repeated. Note that the drive signals applied to the first transfer transistor 241, the second transfer transistor 242, the third transfer transistor 243, the fourth transfer transistor 244, and the discharge transistor 249 are referred to and illustrated as a drive signal TZ14, a drive signal TZ24, a drive signal TRX4, a drive signal TRG4, and a drive signal OFG4, respectively.

A layout of pixel components will be described with reference to FIGS. 3 to 6. FIGS. 3 to 6 are diagrams schematically illustrating examples of the layout of pixel components. In the drawings, the semiconductor substrate is referred to as a semiconductor substrate 100. An XYZ coordinate system is also indicated in the drawings. A thickness direction of the semiconductor substrate 100 corresponds to a Z-axis direction. A direction from a substrate rear surface 100b to a substrate front surface 100a of the semiconductor substrate 100 corresponds to a positive Z-axis direction. A plane direction of the semiconductor substrate 100 corresponds to an X-axis direction and a Y-axis direction (XY-plane direction).

Figure 3:
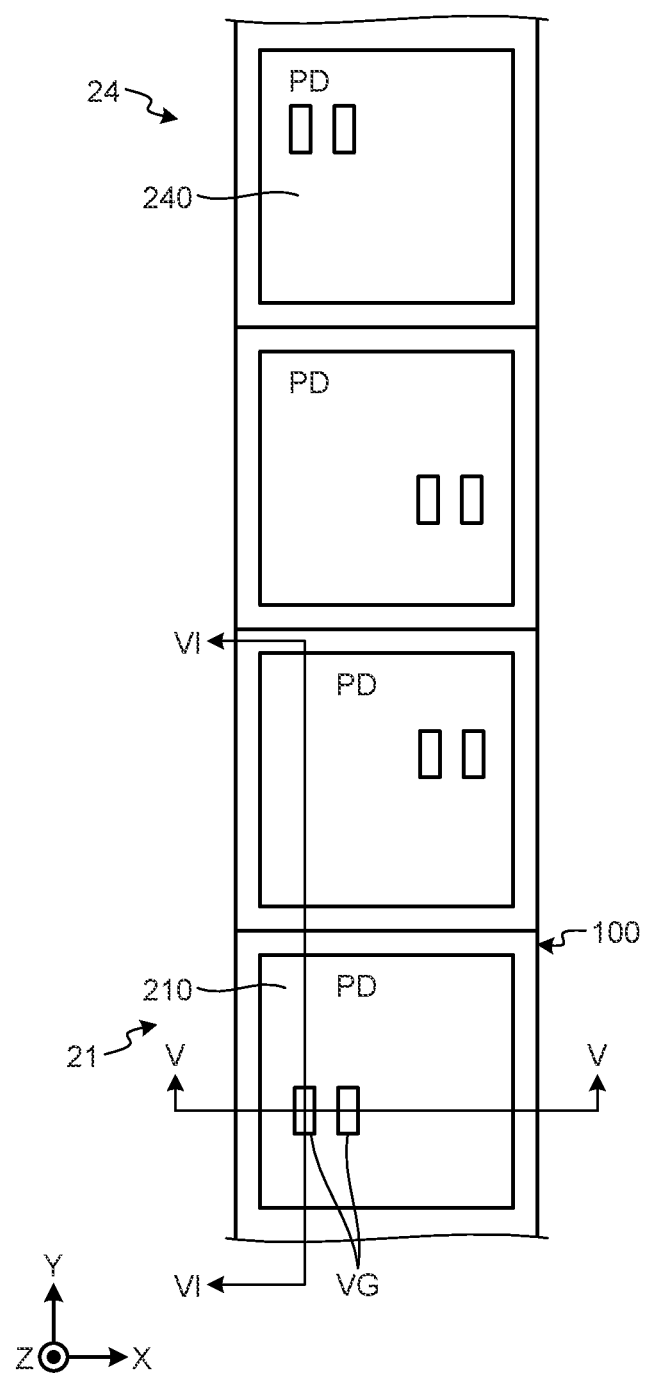
FIG. 3 is a diagram schematically illustrating an example of a layout of pixel components.
Figure 4:
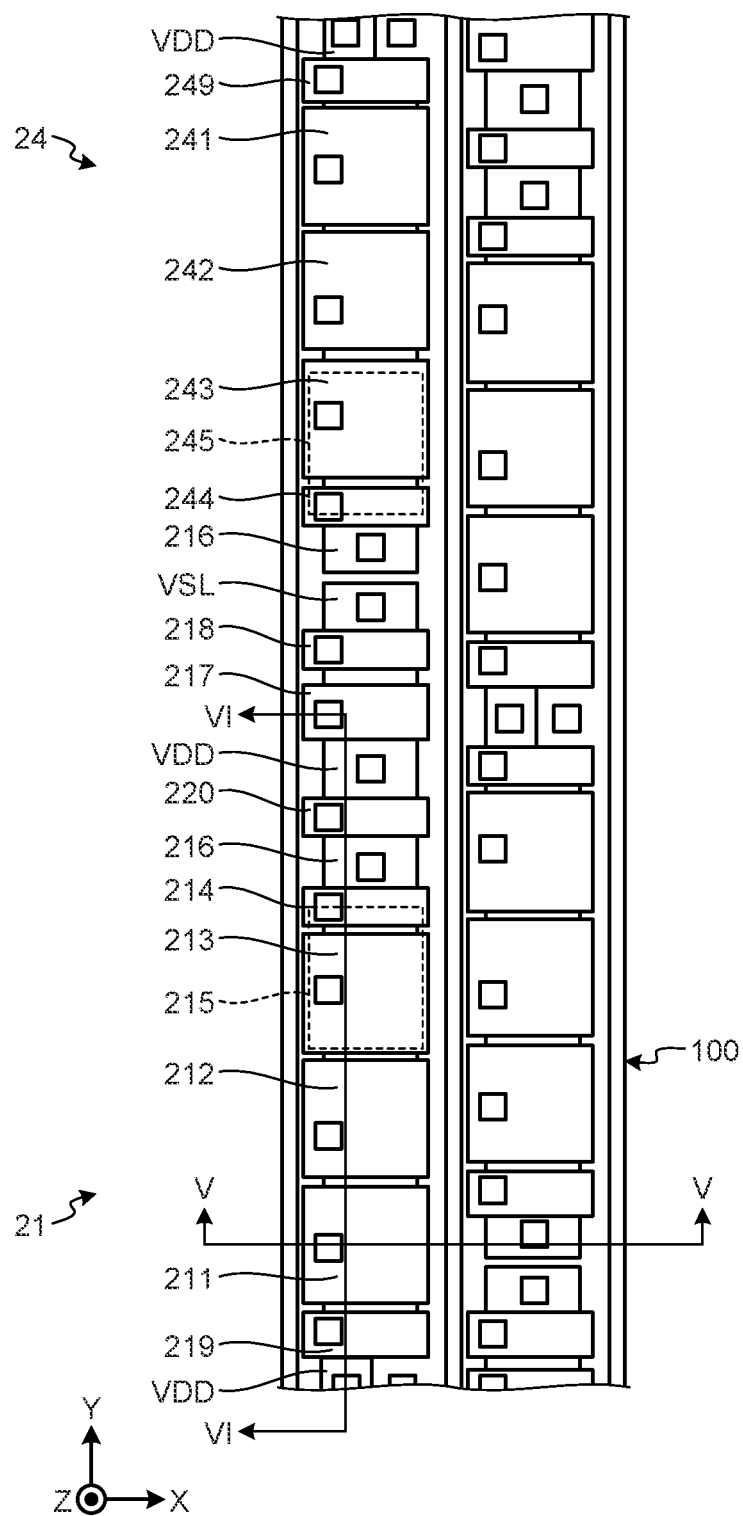
FIG. 4 is a diagram schematically illustrating an example of the layout of the pixel components.

FIGS. 3 and 4 schematically illustrate examples of the layout of the pixel components as viewed in the Z-axis direction. Since the PD, the MEM, and the like overlap in a plan view of the semiconductor substrate 100, the PD, the MEM, and the like are separately illustrated in FIGS. 3 and 4.

FIG. 3 schematically illustrates an example of a planar layout of the PD. FIG. 3 illustrates four PDs provided side by side in a substrate surface direction (in this example, the Y-axis direction). Out of the four PDs, two PDs are the PD 210 of the pixel 21 and the PD 240 of the pixel 24 described above with reference to FIG. 2. The pixel 24 is a pixel three pixels next to the pixel 21, and thus the PD 240 is provided on a side opposite to the PD 210 across the other two PDs. A gate VG located inside the PD 210 is a gate of the first transfer transistor 211 corresponding to the PD 210. A gate corresponding to the first transfer transistor is also located inside each of other PDs.

FIG. 4 schematically illustrates an example of a planar layout of the MEM. Components such as the MEMs corresponding to the PD 210 and the PD 240 are provided side by side in the Y-axis direction. Components such as the MEMs corresponding to the other two PDs are provided side by side in the Y-axis direction adjacent thereto (in the positive X-axis positive direction). A light shielding film (corresponding to a light shielding part 222 in FIGS. 5 and 6 described later) is located therebetween. Hereinafter, components such as the MEMs corresponding to the PD 210 and the PD 240 will be described. Since the MEM 215 and the MEM 245 overlap with the third transfer transistor 213 and the third transfer transistor 243 in the planar layout, the MEM 215 and the MEM 245 are indicated by broken lines. The two FDs 216 are connected by wiring (not illustrated) to configure one FD 216 as described above with reference to FIG. 2. A square portion illustrated inside each component indicates a gate electrode (poly gate).

In the present embodiment, the first transfer transistor 211, the second transfer transistor 212, and the third transfer transistor 213 of the pixel 21 are arranged side by side in the Y-axis direction. The same applies to the first transfer transistor 241, the second transfer transistor 242, and the third transfer transistor 243 of the pixel 24. Other parts are understood from comparison with the circuit configuration of the pixel in FIG. 2.

Figure 5:
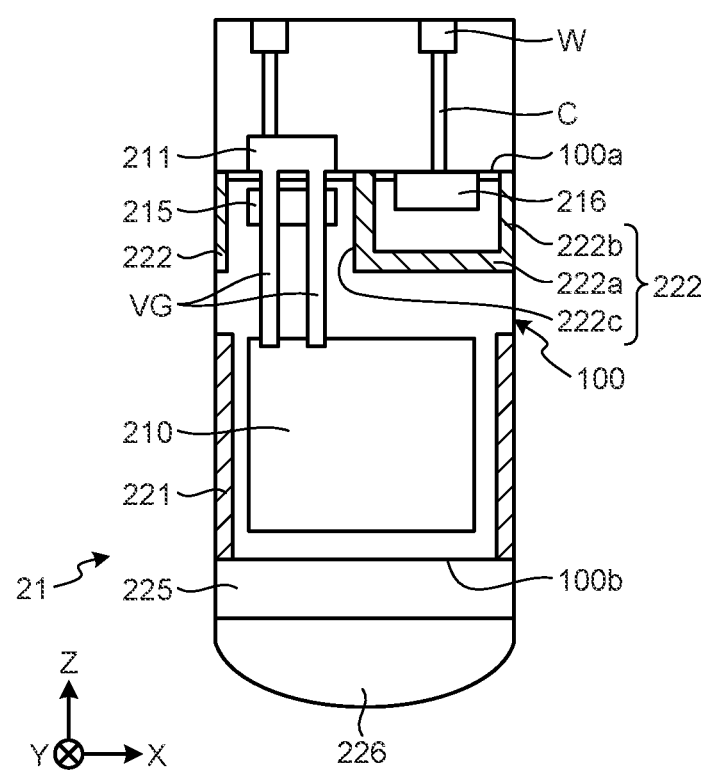
FIG. 5 is a diagram schematically illustrating an example of the layout of the pixel components.
Figure 6:
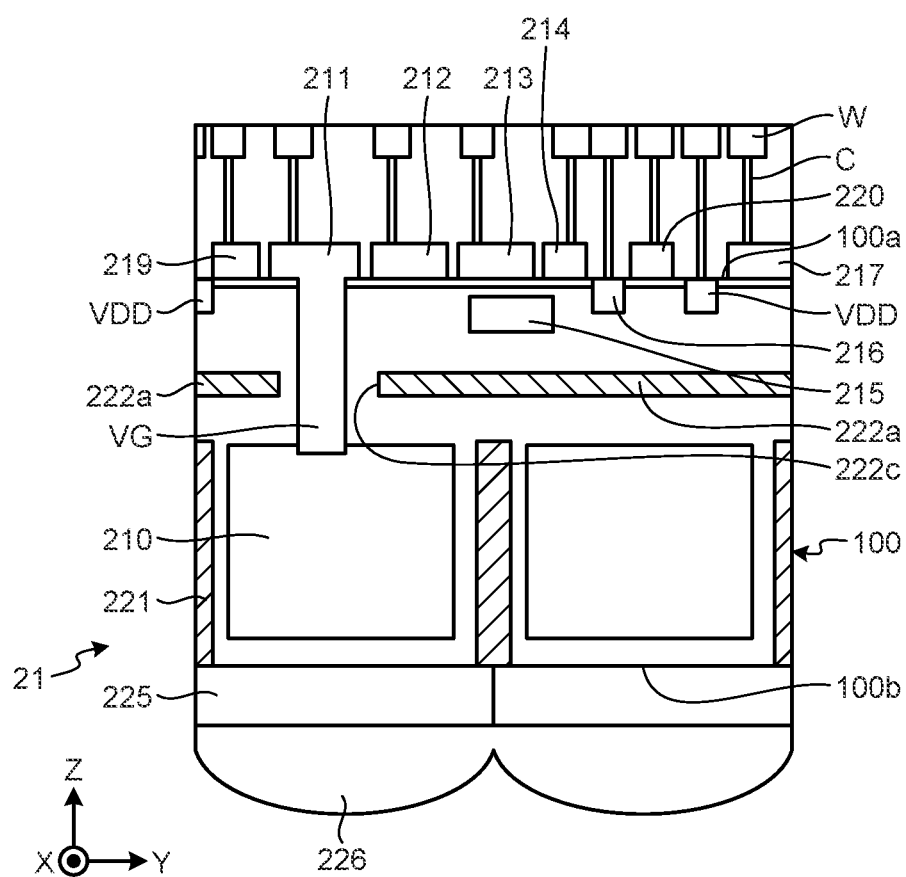
FIG. 6 is a diagram schematically illustrating an example of the layout of the pixel components.

FIGS. 5 and 6 schematically illustrate an example of the layout of the pixel components as viewed in the X-axis direction and the Y-axis direction. FIG. 5 schematically illustrates the layout viewed approximately along line V-V in FIGS. 3 and 4. FIG. 6 schematically illustrates a layout viewed approximately along line VI-VI in FIGS. 3 and 4. For convenience of description, several components located at different positions in a depth direction are illustrated together.

On the substrate rear surface 100*b* of the semiconductor substrate 100, a color filter 225 and an on-chip lens 226 formed of resin or the like are provided in this order. The color filter 225 allows light having a wavelength of a color (e.g., any of RGB) corresponding to the pixel 21 to pass therethrough. Light from a subject passes through the on-chip lens 226 and the color filter 225, and enters the substrate rear surface 100*b* of the semiconductor substrate 100. In other words, the solid-state imaging device 1 (FIG. 1) is a backside-illuminated solid-state imaging device.

The PD 210 is an embedded type PD that is embedded away from the substrate front surface 100*a*. For example, the semiconductor substrate 100 is a p-type semiconductor substrate, and the PD 210 is formed as an n-type impurity region sandwiched between p-type semiconductor regions in the Z-axis direction.

The first transfer transistor 211 is provided on a substrate front surface 100*a* side of the PD 210. The second transfer transistor 212 is provided side by side with the first transfer transistor 211 in the Y-axis direction. The third transfer transistor 213 is provided side by side with the second transfer transistor 212 in the Y-axis direction. These transfer transistors are transfer gates having gates located on the substrate front surface 100*a*. The gates are provided on the substrate front surface 100*a* via an insulating layer (oxide film or the like). However, the first transfer transistor 211 is a vertical transistor in which the gate located on the substrate front surface 100*a* extends in the Z-axis direction to the inside of the semiconductor substrate 100. The gate of the first transfer transistor 211 is referred to as a gate VG (vertical gate) in the drawing.

The MEM 215 is provided on a substrate rear surface 100*b* side of the third transfer transistor 213. For example, the MEM 215 is formed as an n-type impurity region in a portion (portion on a negative Z-direction side) below the third transfer transistor 213.

The FD 216 is connected to the MEM 215 via the fourth transfer transistor 214. The fourth transfer transistor 214 is also the transfer gate similar to the second transfer transistor 212 and the third transfer transistor 213. The FD 216 is formed as, for example, an n-type impurity region.

The light shielding part 222 is a light shielding film that separates the PD 210 and the MEM 215, and is formed so as to cover at least a part of the MEM 215. An example of a material of the light shielding part 222 is metal.

The light shielding part 222 includes a first portion 222*a*, a second portion 222*b*, and an opening 222*c*. The first portion 222*a* extends in the X-axis direction and the Y-axis direction so as to cover a portion of the MEM 215 facing the substrate rear surface 100*b* side (portion on the negative Z-axis direction side). The second portion 222*b* extends in the Z-axis direction from an edge of the first portion 222*a* so as to cover a side portion of the MEM 215. The opening 222*c* is located between the PD 210 and the substrate front surface 100*a*. The opening 222*c* has a size necessary for securing connection between the first transfer transistor 211 and the PD 210. In this example, the opening 222*c* has a size that can pass through the gate VG of the first transfer transistor 211. The gate VG of the first transfer transistor 211 extends to the PD 210 through the opening 222*c*.

Wiring is connected to the gate of each of the transistors via a contact. Among several contacts, one contact is denoted by a reference sign of a contact C. One wiring among several wirings is denoted by a reference sign of a wiring W. Since the contact C and the wiring W are located on the substrate front surface 100*a* side, they do not prevent light from the subject from entering the PD 210. As a result, the light from the subject is efficiently converted into charge. Other components illustrated in FIGS. 5 and 6 are understood from comparison with FIGS. 2 to 4.

The pixel 21 described above includes three transfer transistors, i.e., the first transfer transistor 211, the second transfer transistor 212, and the third transfer transistor 213, provided side by side in the Y-axis direction between the PD 210 and the MEM 215. Therefore, for example, as compared with a case where only two transfer transistors are provided, it is possible to provide the MEM 215 away from the opening 222*c* while securing the potential gradient of the transfer transistors from the PD 210 to the MEM 215. As the MEM 215 is arranged away from the opening 222*c*, leakage of light to the MEM 215 through the opening 222*c* can be suppressed, and thus deterioration of the PLS can be suppressed. Suppression of deterioration of the PLS (improvement of the PLS) will be described with reference to FIG. 7.

Figure 7:
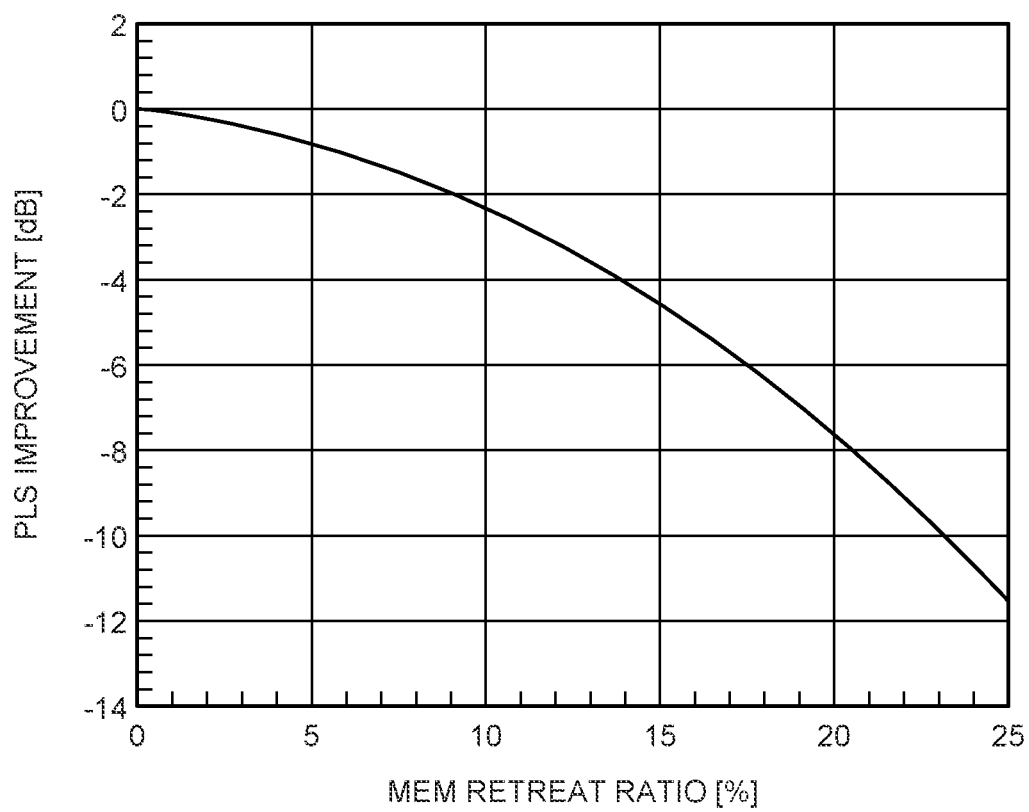
FIG. 7 is a graph illustrating an example of a simulation result.

FIG. 7 is a graph illustrating an example of a simulation result. A horizontal axis of a graph represents an MEM retreat ratio (%), and a vertical axis represents a PLS improvement (dB). The MEM retreat ratio=0% refers to, for example, a position of the MEM 215 in a case where the second transfer transistor 212 is not present and the third transfer transistor 213 and the MEM 215 are arranged close to the opening 222*c* due to the absence of the second transfer transistor 212 in the layout illustrated in FIG. 6. The PLS at this position is determined as the PLS improvement degree=0 dB. The farther the MEM 215 is from the opening 222*c*, the larger the MEM retreat ratio is. As can be seen from the graph, the PLS also improves as the MEM retreat ratio increases.

An example of driving the pixel 21 described above will be described with reference to FIGS. 8 and 9. The illustrated driving is driving in the global shutter type as described above.

Figure 8:
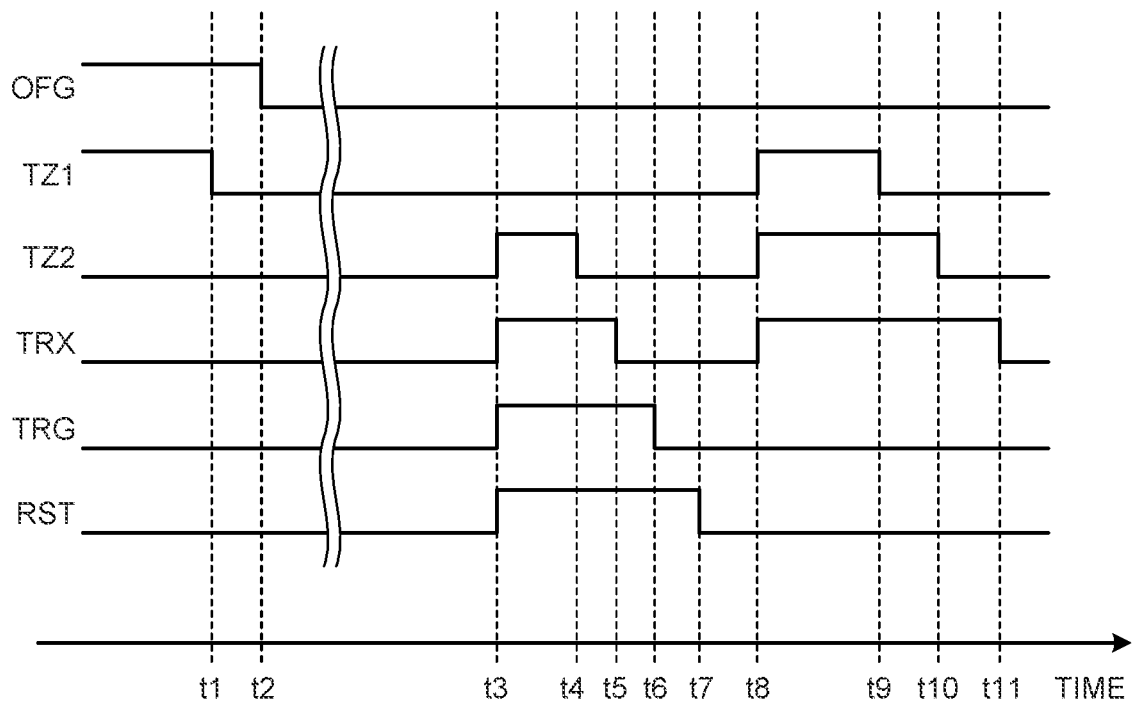
FIG. 8 is a diagram illustrating an example of a timing chart of drive signals.
Figure 9:
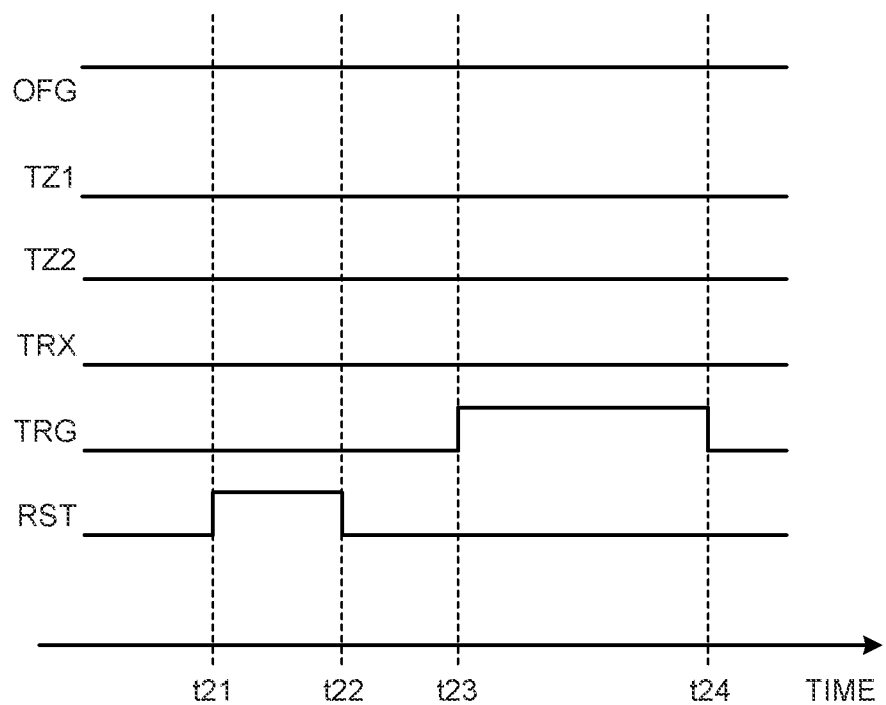
FIG. 9 is a diagram illustrating an example of the timing chart of the drive signals.

FIGS. 8 and 9 are diagrams illustrating examples of timing charts of the drive signals. FIG. 8 illustrates an example of the drive signal (in the global transfer operation) in the operation of transferring and holding the charge accumulated in the PD 210 to the MEM 215. Note that not only the pixel 21 but also any pixel is driven in the same manner. Therefore, although the drive signal is supplied to the pixel 21, the following description refers to the drive signal TZ1, the drive signal TZ2, the drive signal TRX, the drive signal TRG, the drive signal SEL, the drive signal OFG, and the drive signal RST. Initially, the drive signal OFG of the discharge transistor 219 and the drive signal TZ1 of the first transfer transistor 211 are in an on state, and the PD 210 is reset.

At time t1, the drive signal TZ1 of the first transfer transistor 211 is turned off, and exposure starts. At subsequent time t2, the drive signal OFG is also turned off.

At time t3, the drive signal TZ2 of the second transfer transistor 212, the drive signal TRX of the third transfer transistor 213, the drive signal TRG of the fourth transfer transistor 214, and the drive signal RST of the reset transistor 220 are turned on. At subsequent time t4, time t5, time t6, and time t7, the drive signal TZ2, the drive signal TRX, the drive signal TRG, and the drive signal RST are sequentially turned off. As a result, the MEM 215 is reset.

At time t8, the drive signal TZ11 of the first transfer transistor 211, the drive signal TZ21 of the second transfer transistor 212, and the drive signal TRX of the third transfer transistor 213 are turned on, and the exposure ends.

At time t9, time t10, and time t11, the drive signal TZ1 of the first transfer transistor 211, the drive signal TZ2 of the second transfer transistor 212, and the drive signal TRX of the third transfer transistor 213 are sequentially turned off. As a result, the charge accumulated in the PD 210 during the exposure period is transferred to and held in the MEM 215. Note that the potential diagram in the global transfer operation will be described later with reference to FIGS. 10 to 13.

FIG. 9 illustrates an example of the drive signal in the operation of reading the charge accumulated in the MEM 215 (rolling read operation). The drive signal OFG is always on. At time t21, the drive signal RST of the reset transistor 220 is turned on, and at time t22, the drive signal RST is turned off. As a result, the FD 216 is reset.

At time t23, the drive signal TRG of the fourth transfer transistor 214 is turned on, and at subsequent time t24, the drive signal TRG is turned off. As a result, the charge held in the MEM 215 is transferred to the FD 216. As described above with reference to FIG. 2, the charge transferred to the FD 216 is converted into an electric signal and output as a pixel signal via the amplification transistor 217, the selection transistor 218, and the vertical signal line VSL.

Figure 10:
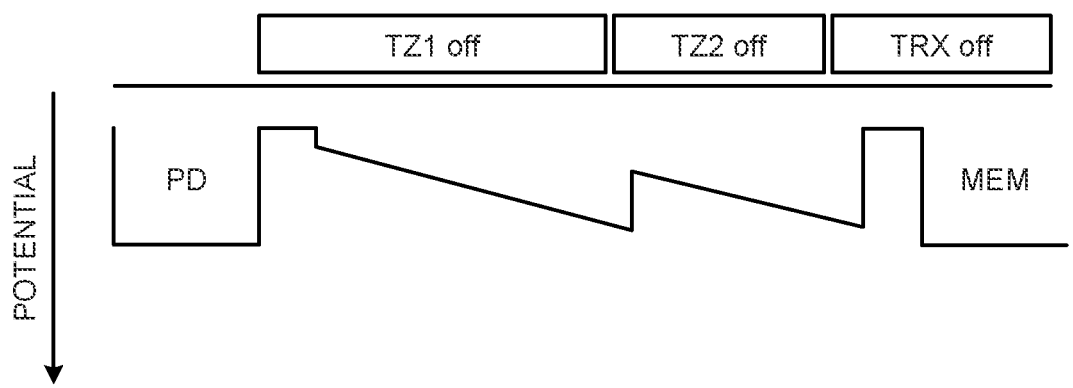
FIG. 10 is a diagram illustrating an example of a potential diagram.
Figure 11:
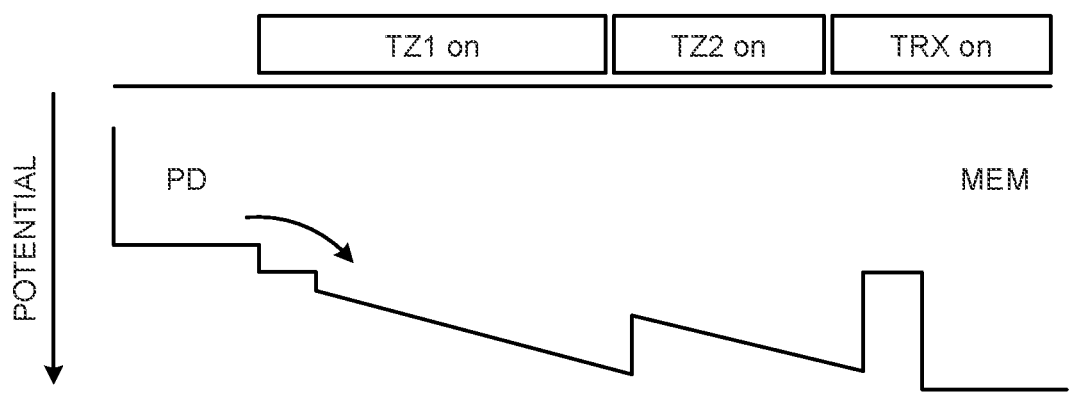
FIG. 11 is a diagram illustrating an example of the potential diagram.
Figure 12:
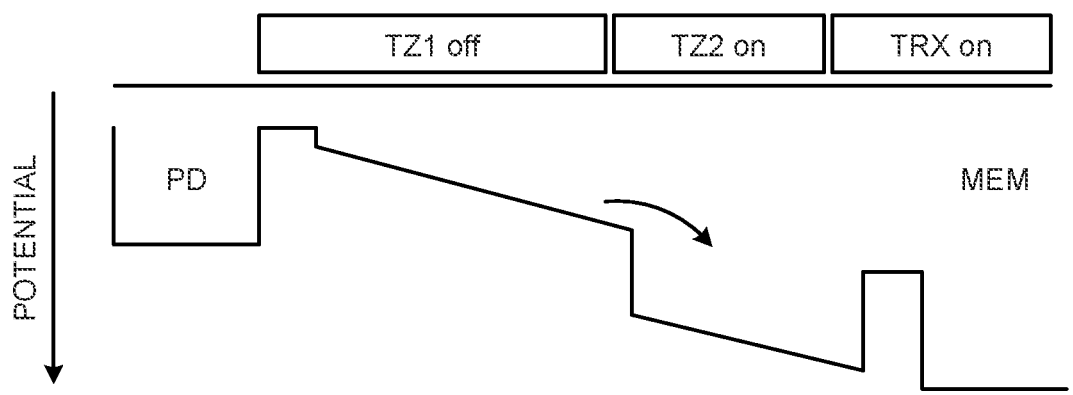
FIG. 12 is a diagram illustrating an example of the potential diagram.
Figure 13:
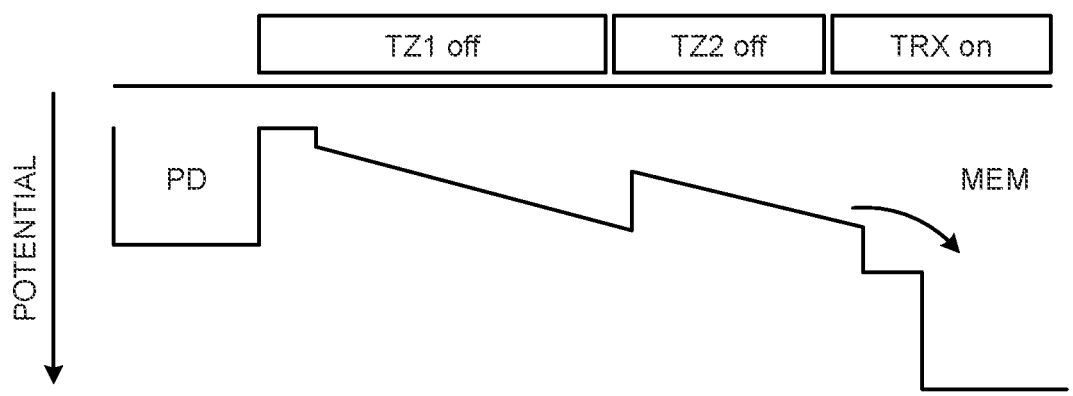
FIG. 13 is a diagram illustrating an example of the potential diagram.

FIGS. 10 to 13 are diagrams illustrating examples of potential diagrams in the global transfer operation. As illustrated in FIG. 10, when the drive signal TZ1 of the first transfer transistor 211, the drive signal TZ2 of the second transfer transistor 212, and the drive signal TRX of the third transfer transistor 213 are all off, a potential difference is formed so that the charge does not move from the PD 210 to other parts. Therefore, the charge is accumulated in the PD 210. As illustrated in FIG. 11, when all of the drive signal TZ1, the drive signal TZ2, and the drive signal TRX are turned on, the above-described potential difference is eliminated, and the charge accumulated in the PD 210 moves toward the MEM 215. As illustrated in FIGS. 12 and 13, when the drive signal TZ1 and the drive signal TZ2 are sequentially turned off, the charge is transferred to the MEM 215 and held according to the potential gradients of the first transfer transistor 211, the second transfer transistor 212, and the third transfer transistor 213.

Figure 14:
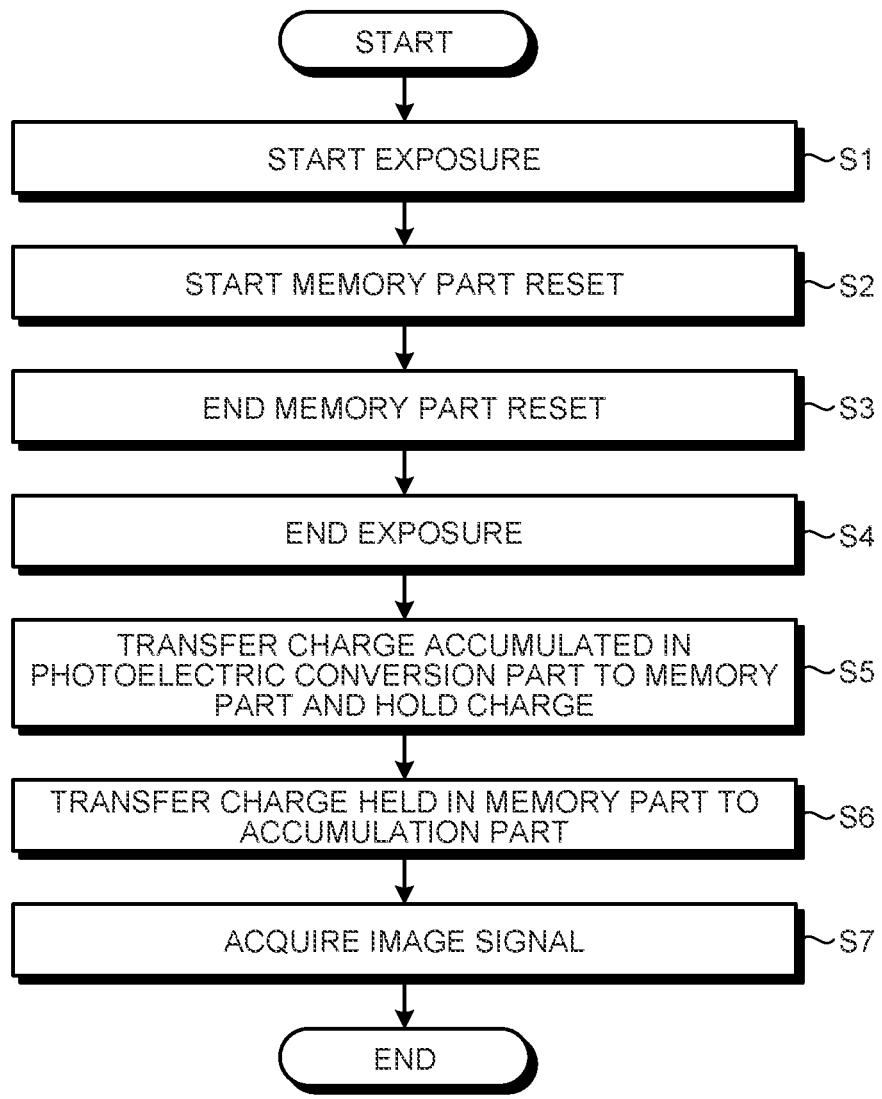
FIG. 14 is a flowchart illustrating an example of a process executed in the solid-state imaging device (pixel driving method).

The pixel driving will be described with reference to a flowchart. FIG. 14 is a flowchart illustrating an example of a process (pixel driving method) executed in the solid-state imaging device. This process is executed, for example, by controlling the vertical drive circuit unit 3 and the horizontal drive circuit unit 4 by the system control unit 8 (FIG. 1). Similarly to FIGS. 7 and 8 described above, the drive signal supplied to the pixel 21 will be described as the drive signal TZ1, the drive signal TZ2, the drive signal TRX, the drive signal TRG, the drive signal SEL, the drive signal OFG, and the drive signal RST. Initially, the drive signal OFG of the discharge transistor 219 and the drive signal TZ1 of the first transfer transistor 211 are in an on state, and the PD 210 is reset.

In Step S1, exposure starts. For example, as described above with reference to FIG. 8, the drive signal TZ1 of the first transfer transistor 211 and the drive signal OFG of the discharge transistor 219 are turned off. As a result, the charge starts to be accumulated in the PD 210.

In Step S2, resetting of the memory part starts. For example, as described above with reference to FIG. 8, the drive signal TZ2 of the second transfer transistor 212, the drive signal TRX of the third transfer transistor 213, the drive signal TRG of the fourth transfer transistor 214, and the drive signal RST of the reset transistor 220 are turned on. As a result, the MEM 215 is reset by the power supply VDD.

In Step S3, the reset of the memory part ends. For example, as described above with reference to FIG. 8, the drive signal TZ2 of the second transfer transistor 212, the drive signal TRX of the third transfer transistor 213, the drive signal TRG of the fourth transfer transistor 214, and the drive signal RST of the reset transistor 220 are sequentially turned off.

In Step S4, the exposure ends. For example, as described above with reference to FIG. 8, the drive signal TZ1 of the first transfer transistor 211, the drive signal TZ2 of the second transfer transistor 212, and the drive signal TRX of the third transfer transistor 213 are turned on.

In Step S5, the charge accumulated in the photoelectric conversion part is transferred to the memory part and held therein. For example, as described above with reference to FIG. 8, the drive signal TZ1 of the first transfer transistor 211, the drive signal TZ2 of the second transfer transistor 212, and the drive signal TRX of the third transfer transistor 213 are sequentially turned off. The charge accumulated in the PD 210 is transferred to and held in the MEM 215.

In Step S6, the charge held in the memory part is transferred to the accumulation part. For example, as described above with reference to FIG. 9, the drive signal RST is turned on and off, and the FD 216 is reset. The charge held in the MEM 215 is transferred to the FD 216 by turning on and off the drive signal TRG.

In Step S7, the pixel signal is acquired. For example, as described above with reference to FIG. 2, the electric signal corresponding to the charge accumulated in the FD 216 is output as the pixel signal via the amplification transistor 217, the selection transistor 218, and the vertical signal line VSL.

After the process in Step S7 is completed, the process in the flowchart ends. For example, by this process, each of the plurality of pixels 20 in the pixel array 2 of the solid-state imaging device 1 can be driven.

According to the first embodiment, by providing three transfer transistors, i.e., the first transfer transistor 211, the second transfer transistor 212, and the third transfer transistor 213, it is possible to arrange the MEM 215 away from the opening 222c in the light shielding part 222. As a result, deterioration of PLS can be suppressed. Various embodiments other than the first embodiment described above are conceivable within a range in which similar effects can be achieved. Hereinafter, some embodiments will be described particularly with respect to differences from the first embodiment.

2. Second Embodiment

A second embodiment is different in that a pixel transistor is provided on a semiconductor substrate different from the PD and the MEM.

Figure 15:
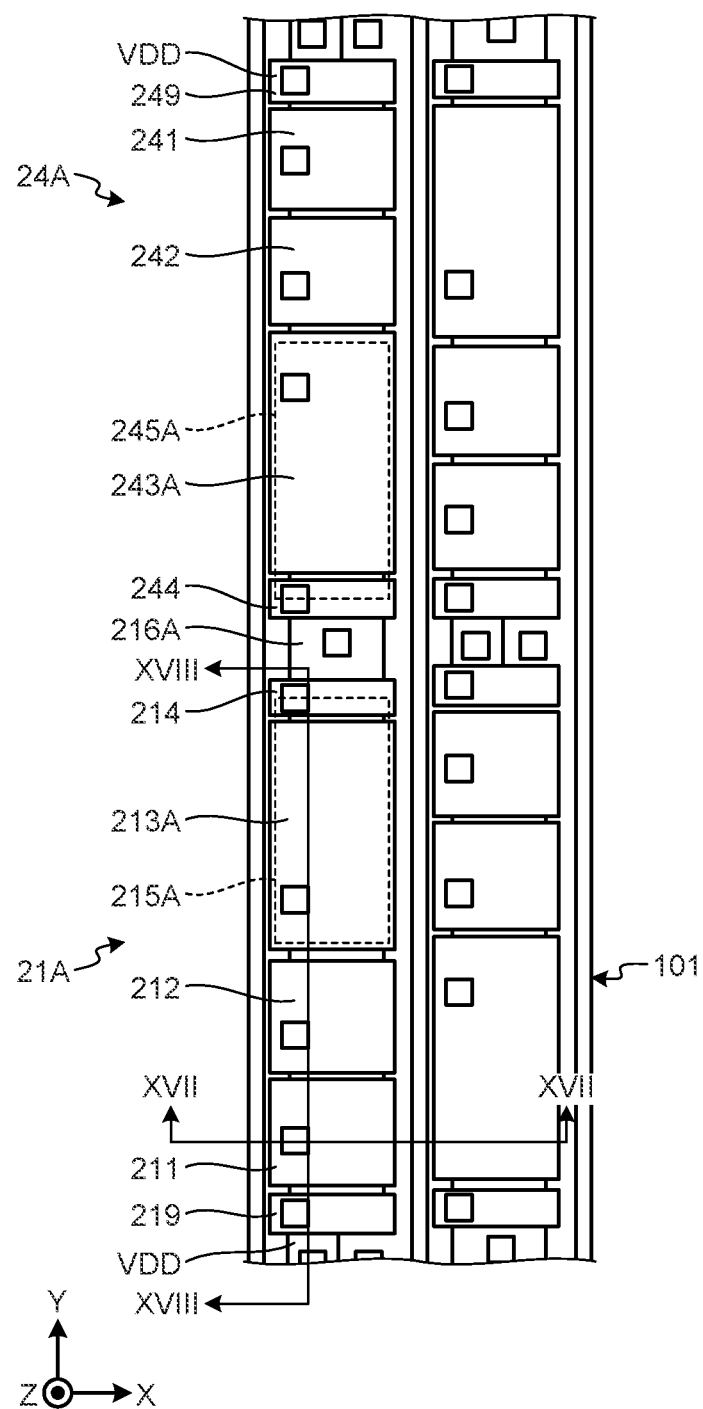
FIG. 15 is a diagram schematically illustrating an example of a layout of pixel components.
Figure 16:
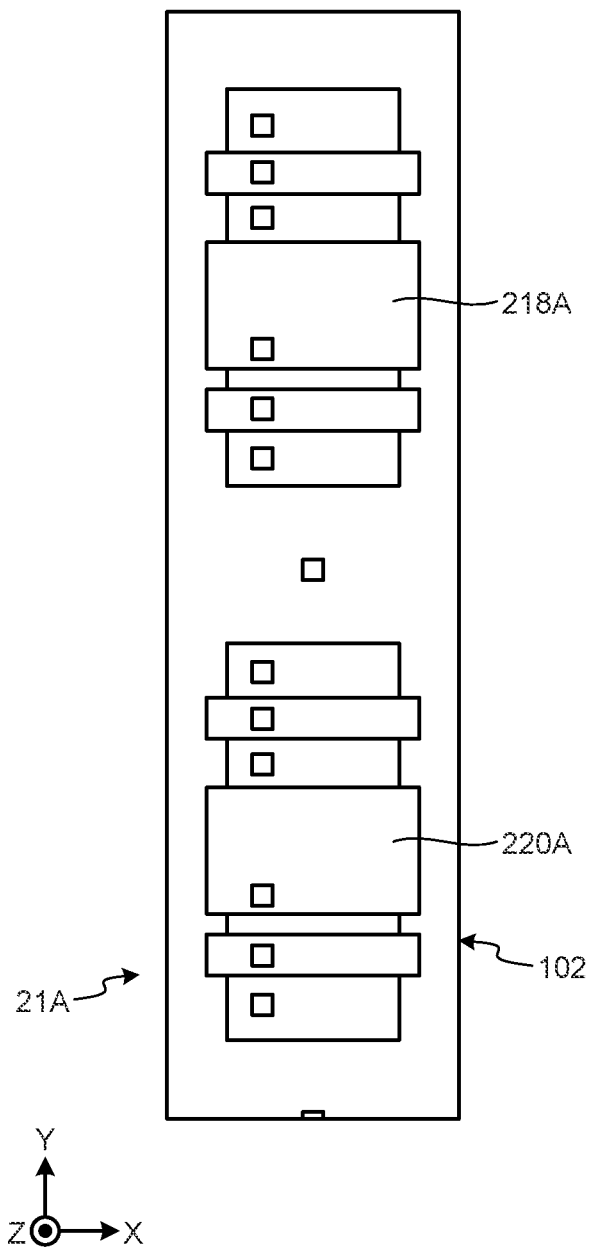
FIG. 16 is a diagram schematically illustrating an example of the layout of the pixel components.
Figure 17:
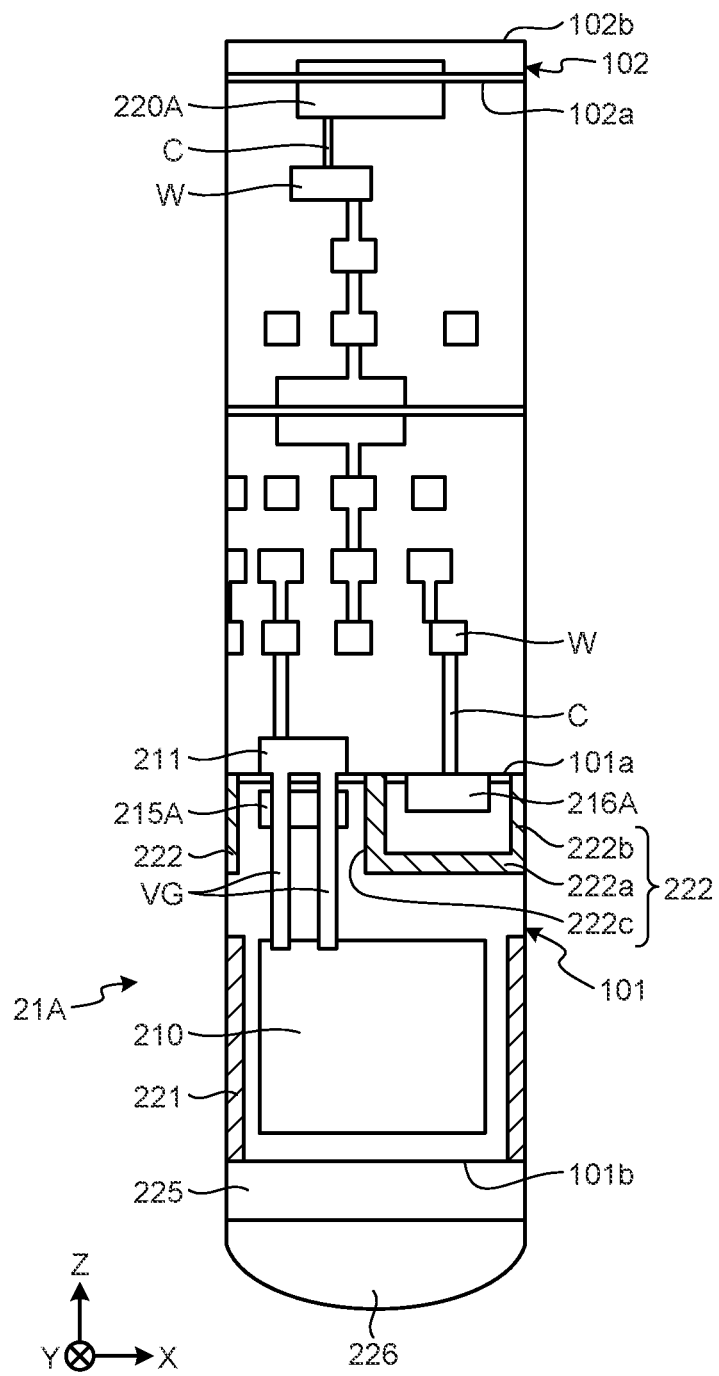
FIG. 17 is a diagram schematically illustrating an example of the layout of the pixel components.
Figure 18:
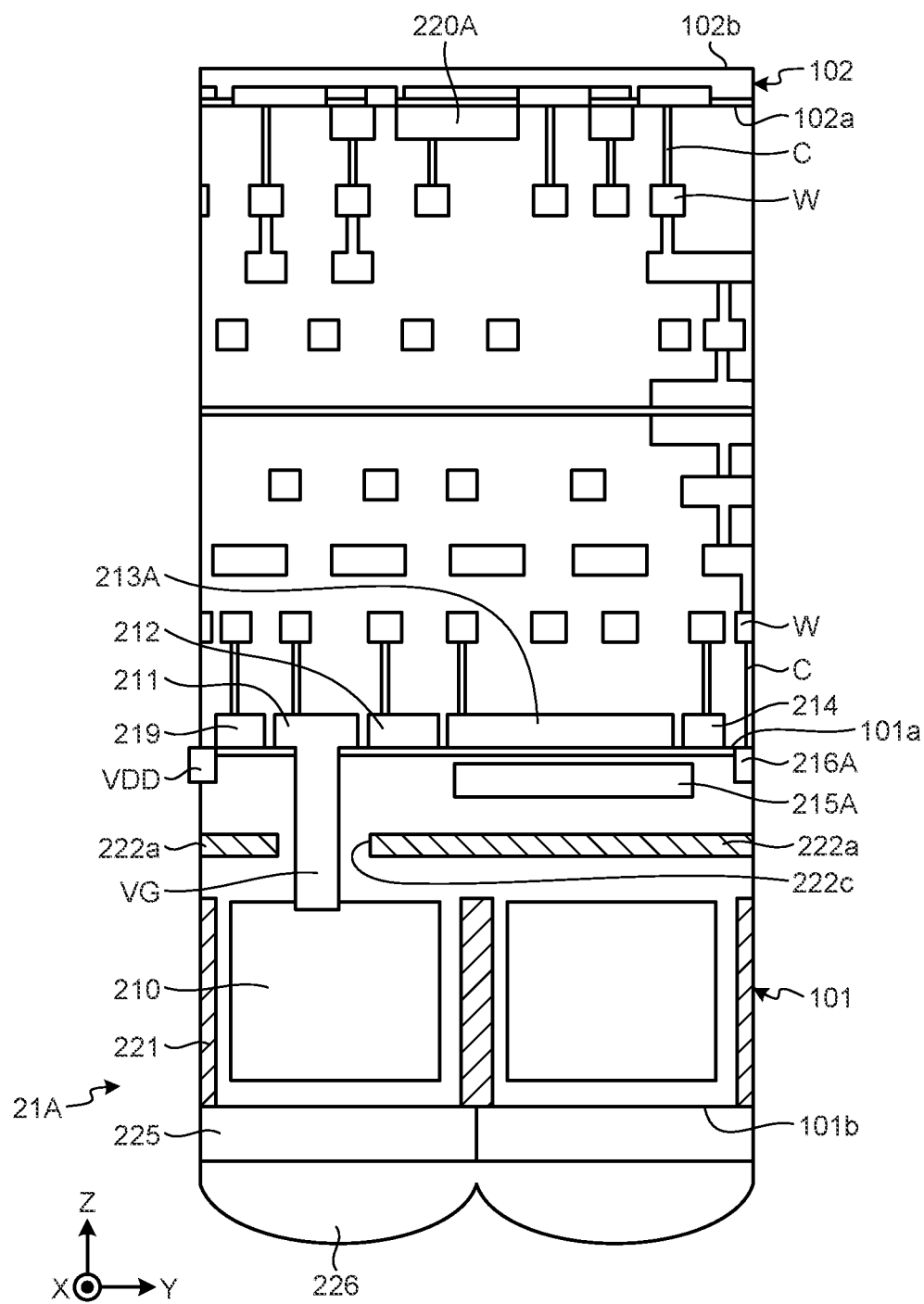
FIG. 18 is a diagram schematically illustrating an example of the layout of the pixel components.

FIGS. 15 to 18 are diagrams schematically illustrating layouts of pixel components. FIGS. 15 and 16 schematically illustrate an example of the layout of the pixel components as viewed in the Z-axis direction. Since the layout of the PD is similar to that of the first embodiment (FIG. 3), the description thereof will not be repeated here. FIGS. 17 and 18 schematically illustrate an example of the layout of the pixel components as viewed approximately along lines XVII and XVIII in FIG. 15 (viewed in the Y-axis direction and the X-axis direction).

Among components of a pixel 21A and a pixel 24A, the first transfer transistor 211 and the first transfer transistor 241, the second transfer transistor 212 and the second transfer transistor 242, a third transfer transistor 213A and a third transfer transistor 243A, the fourth transfer transistor 214 and the fourth transfer transistor 244, an MEM 215A and an MEM 245A, an FD 216A, the discharge transistor 219, and the discharge transistor 249 are provided on a semiconductor substrate 101 (first semiconductor substrate). The same applies to the remaining two pixels.

Among the components of the pixel 21A and the pixel 24A, a selection transistor 218A and a reset transistor 220A are provided on a semiconductor substrate 102 (second semiconductor substrate). The selection transistor 218A and the reset transistor 220A are pixel transistors that output a voltage corresponding to charges accumulated in the FD 216A. The semiconductor substrate 102 is a substrate different from the semiconductor substrate 101.

The semiconductor substrate 101 and the semiconductor substrate 102 are laminated by, for example, Cu—Cu connection (bonding). The components provided on the semiconductor substrate 101 and the semiconductor substrate 102 are connected via the contact C and the wiring W provided on a substrate front surface 101a of the semiconductor substrate 101 and a substrate front surface 102a of the semiconductor substrate 102. Note that the substrate rear surfaces of the semiconductor substrate 101 and the semiconductor substrate 102 are referred to as a substrate rear surface 101b and a substrate rear surface 102b, respectively.

Areas of the third transfer transistor 213A and the MEM 215A of the pixel 21A are larger than areas of the third transfer transistor 213 and the MEM 215 (FIG. 4 and the like) of the pixel 21. This is because, unlike the semiconductor substrate 100 (FIG. 4 and the like), the semiconductor substrate 101 can use a space not provided with the selection transistor 218 and the reset transistor 220. Same applies to the fourth transfer transistor 214A and the MEM 215A of the pixel 24A. Note that, unlike the FD 216 (FIG. 4 and the like), the FD 216A is collectively provided in one place.

According to the second embodiment, the area of the MEM 215A provided on the semiconductor substrate 101 can be increased for the area of the pixel transistors (e.g., the selection transistor 218A and the reset transistor 220A) provided on the semiconductor substrate 102.

The above describes a face-to-face structure in which the poly gate (contact C) provided on the substrate front surface 101a of the semiconductor substrate 101 and the poly gate provided on the substrate front surface 102a of the semiconductor substrate 102 are bonded to each other so as to face each other. However, a face-to-back structure may be adopted. Furthermore, although the example describes the case where the selection transistor 218 and the reset transistor 220 among the components of the pixel 21 are provided on the semiconductor substrate 102, various other components may be provided on the semiconductor substrate 102 together with or instead of the selection transistor 218 and the reset transistor 220. In the following embodiments, cases where a laminated substrate structure is provided similarly to the second embodiment will be described.

3. Third Embodiment

In a third embodiment, a plurality of second transfer transistors is provided side by side in the Y-axis direction.

Figure 19:
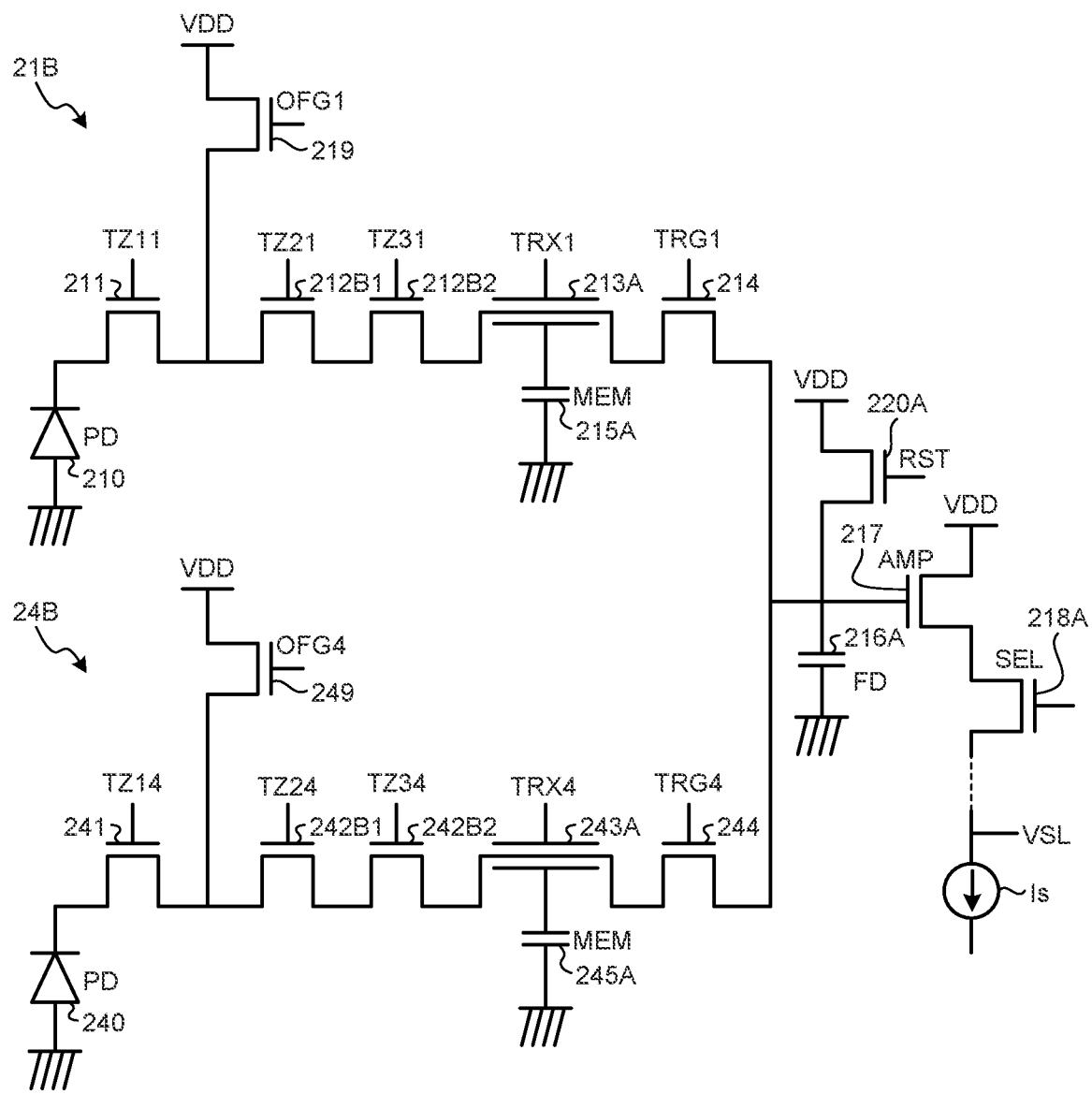
FIG. 19 is a diagram illustrating an example of a circuit configuration of the pixel.

FIG. 19 is a diagram illustrating an example of a circuit configuration of a pixel. A pixel 21B illustrated in FIG. 19 is different from the pixel 21A (FIG. 15 and the like) in that a second transfer transistor 212B1 and a second transfer transistor 212B2 are provided instead of the second transfer transistor 212. The drive signal TZ21 is applied to the second transfer transistor 212B1. The drive signal TZ31 is applied to the second transfer transistor 212B1. Similarly, a pixel 24B includes the second transfer transistor 242B1 and the second transfer transistor 242B2 to which a drive signal TZ24 and a drive signal TZ34 are applied.

Figure 20:
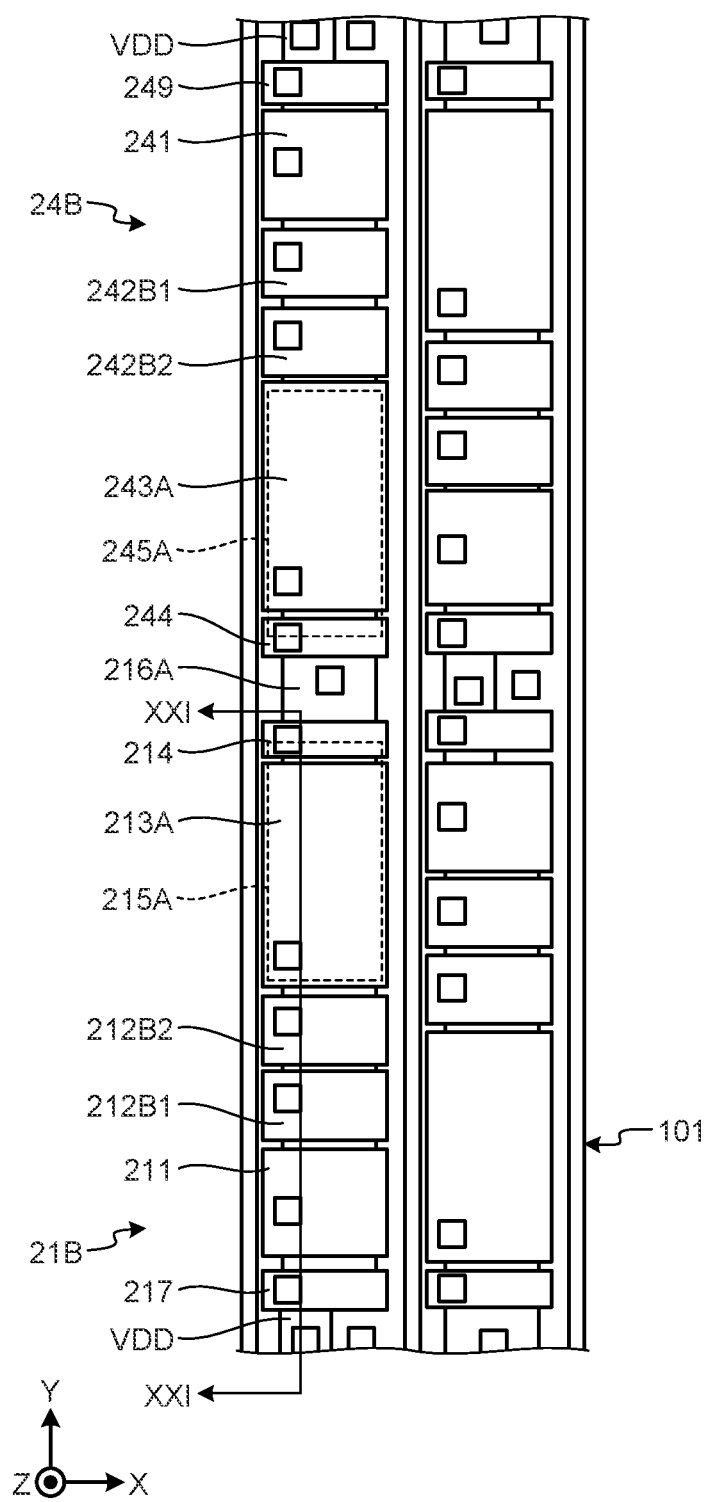
FIG. 20 is a diagram schematically illustrating an example of the layout of pixel components.
Figure 21:
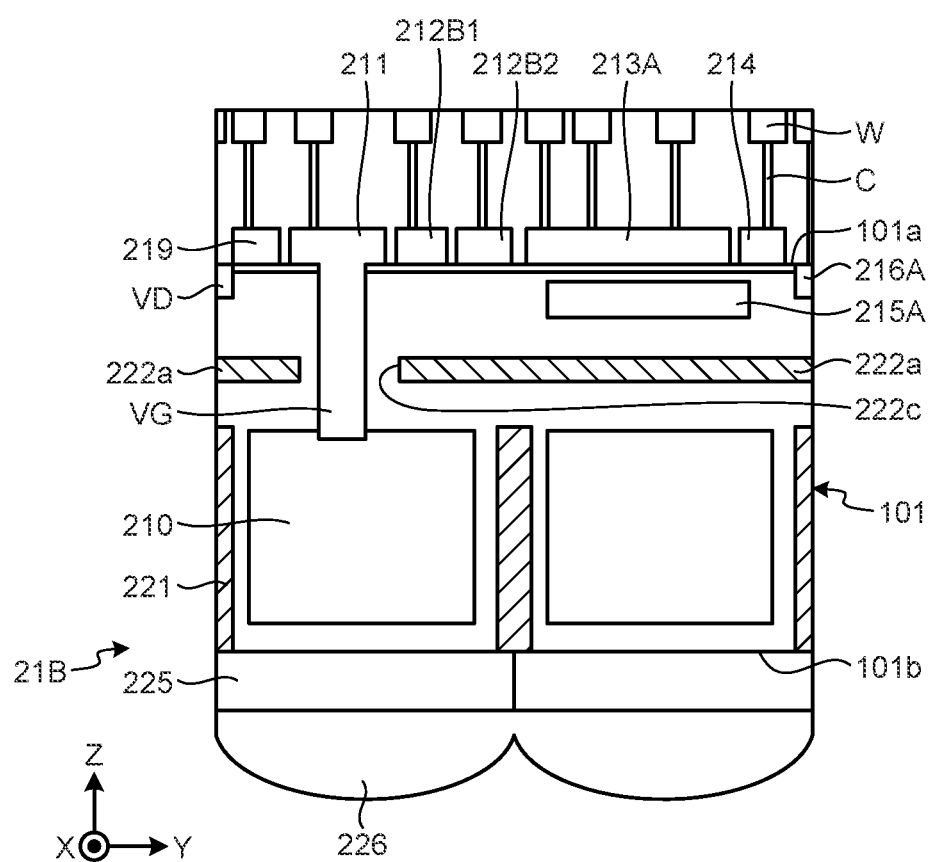
FIG. 21 is a diagram schematically illustrating an example of the layout of pixel components.

FIGS. 20 and 21 are diagrams schematically illustrating layouts of pixel components. FIG. 20 schematically illustrates an example of a layout of the pixel components as viewed in the Z-axis direction. FIG. 21 schematically illustrates an example of a layout of the pixel components as viewed approximately along line XXI in FIG. 20 (viewed in the X-axis direction). In the Y-axis direction, the second transfer transistor 212B2 is provided between the second transfer transistor 212B1 and the third transfer transistor 213A.

When the number of second transfer transistors added to the pixel 21 and the drive signal are generalized, the drive signal is represented as a drive signal TZi1 (i=m+2), whereas m is the number of additional second transfer transistors.

According to the third embodiment, since the plurality of second transfer transistors is provided, the MEM 215A can be arranged further away from the opening 222c. Therefore, the effect of suppressing the deterioration of PLS can be further enhanced.

4. Fourth Embodiment

In a fourth embodiment, a plurality of third transfer transistors is provided side by side in the Y-axis direction.

Figure 22:
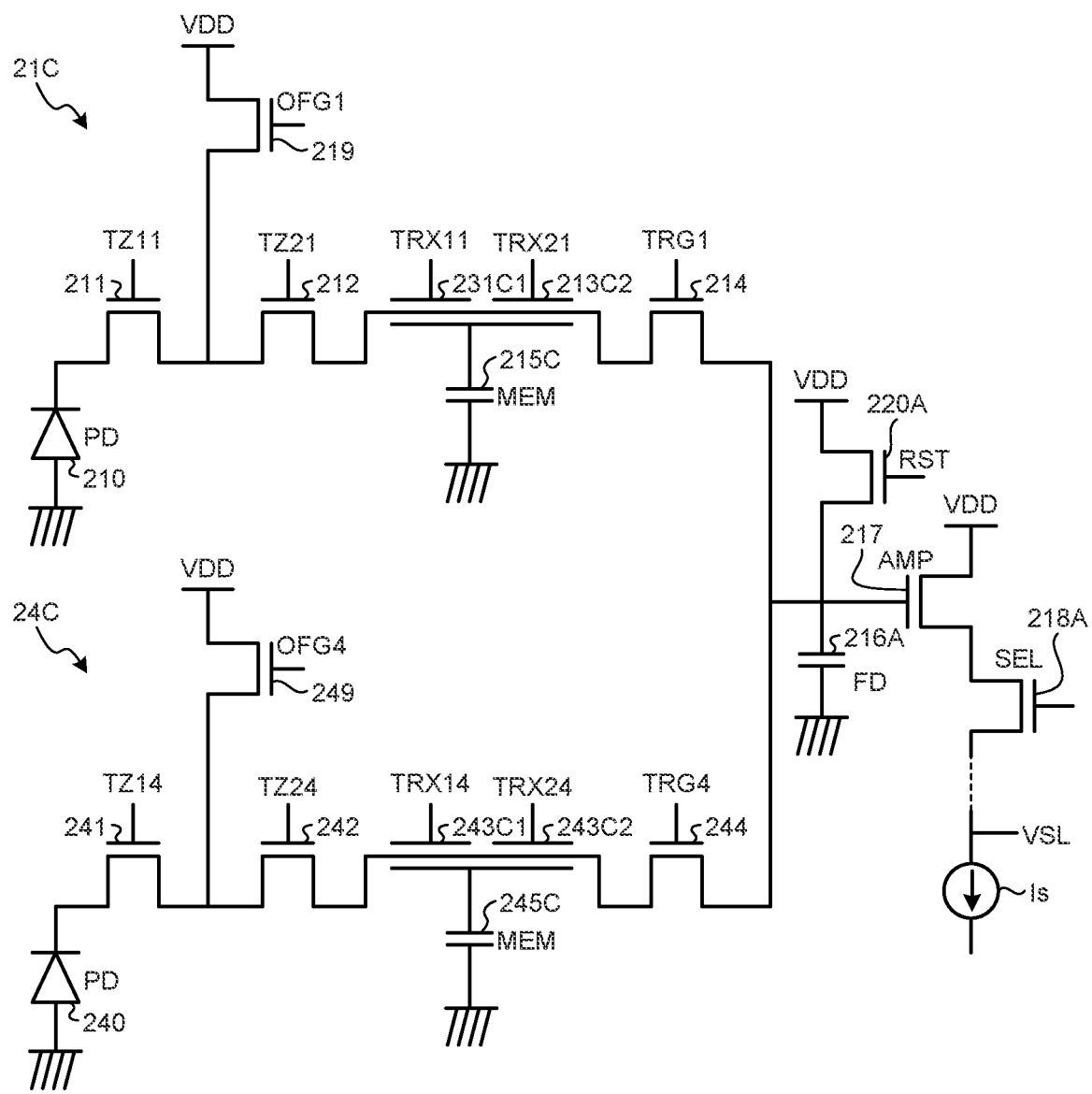
FIG. 22 is a diagram illustrating an example of a circuit configuration of the pixel.

FIG. 22 is a diagram illustrating an example of a circuit configuration of a pixel. A pixel 21C illustrated in FIG. 22 is different from the pixel 21A (FIG. 15 and the like) in that a third transfer transistor 213C1 and a third transfer transistor 213C2 are provided instead of the third transfer transistor 213, and an MEM 215C is provided instead of the MEM 215A. The drive signal TRX11 is applied to the third transfer transistor 213C1. The drive signal TRX21 is applied to the third transfer transistor 213C2. Similarly, the pixel 24C includes a third transfer transistor 243C1 and a third transfer transistor 243C2 to which a drive signal TRX14 and a drive signal TRX24 are applied, and an MEM 245C.

Figure 23:
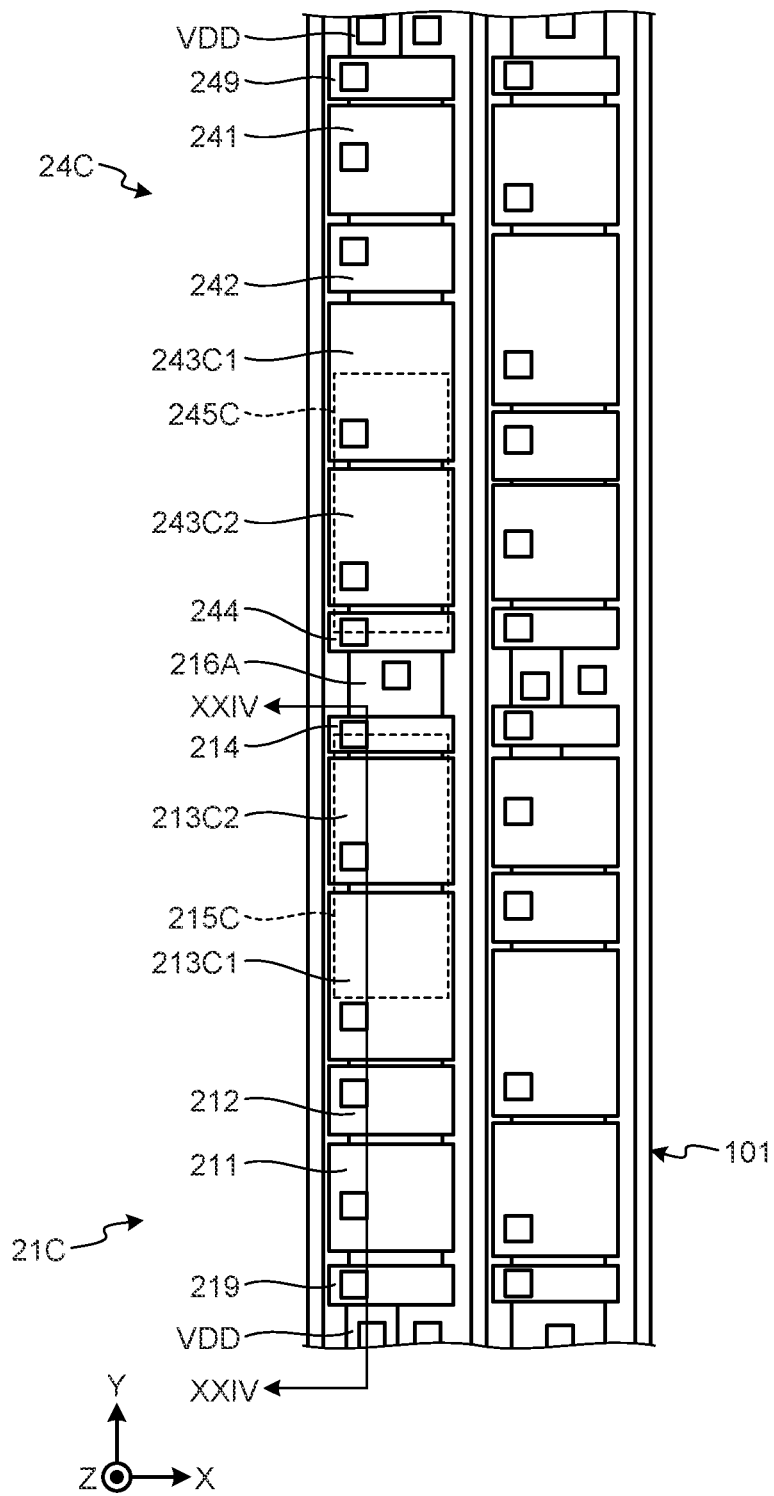
FIG. 23 is a diagram schematically illustrating an example of a layout of pixel components.
Figure 24:
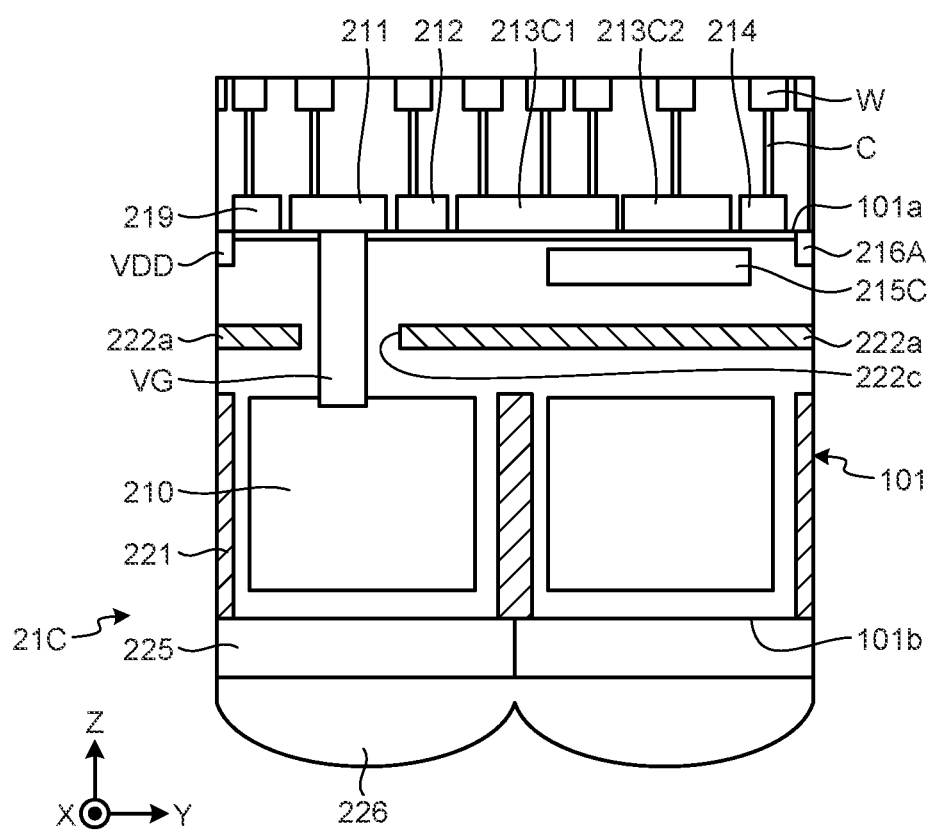
FIG. 24 is a diagram schematically illustrating an example of the layout of the pixel components.

FIGS. 23 and 24 are diagrams schematically illustrating layouts of pixel components. FIG. 23 schematically illustrates an example of a layout of the pixel components as viewed in the Z-axis direction. FIG. 24 schematically illustrates an example of a layout of the pixel components as viewed approximately along a VVIV line in FIG. 23 (viewed in the X-axis direction). In the Y-axis direction, the third transfer transistor 213C2 is provided to be connected to the third transfer transistor 213C1 on a side opposite to the second transfer transistor 212 with the third transfer transistor 213C1 interposed therebetween. In this example, the MEM 215C is provided at a position closer to the third transfer transistor 213C2 than the third transfer transistor 213C1.

When the number of third transfer transistors added to the pixel 21 and the drive signal are generalized, the drive signal is represented as a drive signal TRXj1 (j=n+2), whereas n is the number of additional third transfer transistors.

According to the fourth embodiment, since the plurality of third transfer transistors is provided, the MEM 215C can be disposed further away from the opening 222c. Therefore, the effect of suppressing the deterioration of PLS can be further enhanced. In addition, saturation characteristics of the MEM 215C can be improved by increasing the number of transistors provided (multistage gate) with respect to the MEM 215C.

5. Fifth Embodiment

In a fifth embodiment, transfer transistors corresponding to the plurality of second transfer transistors and the plurality of third transfer transistors are connected to a common drive signal line. For example, the common drive signal is used for the corresponding drive signal among the drive signal TZi1 described in the third embodiment and the drive signal TRXj1 described in the fourth embodiment.

Figure 25:
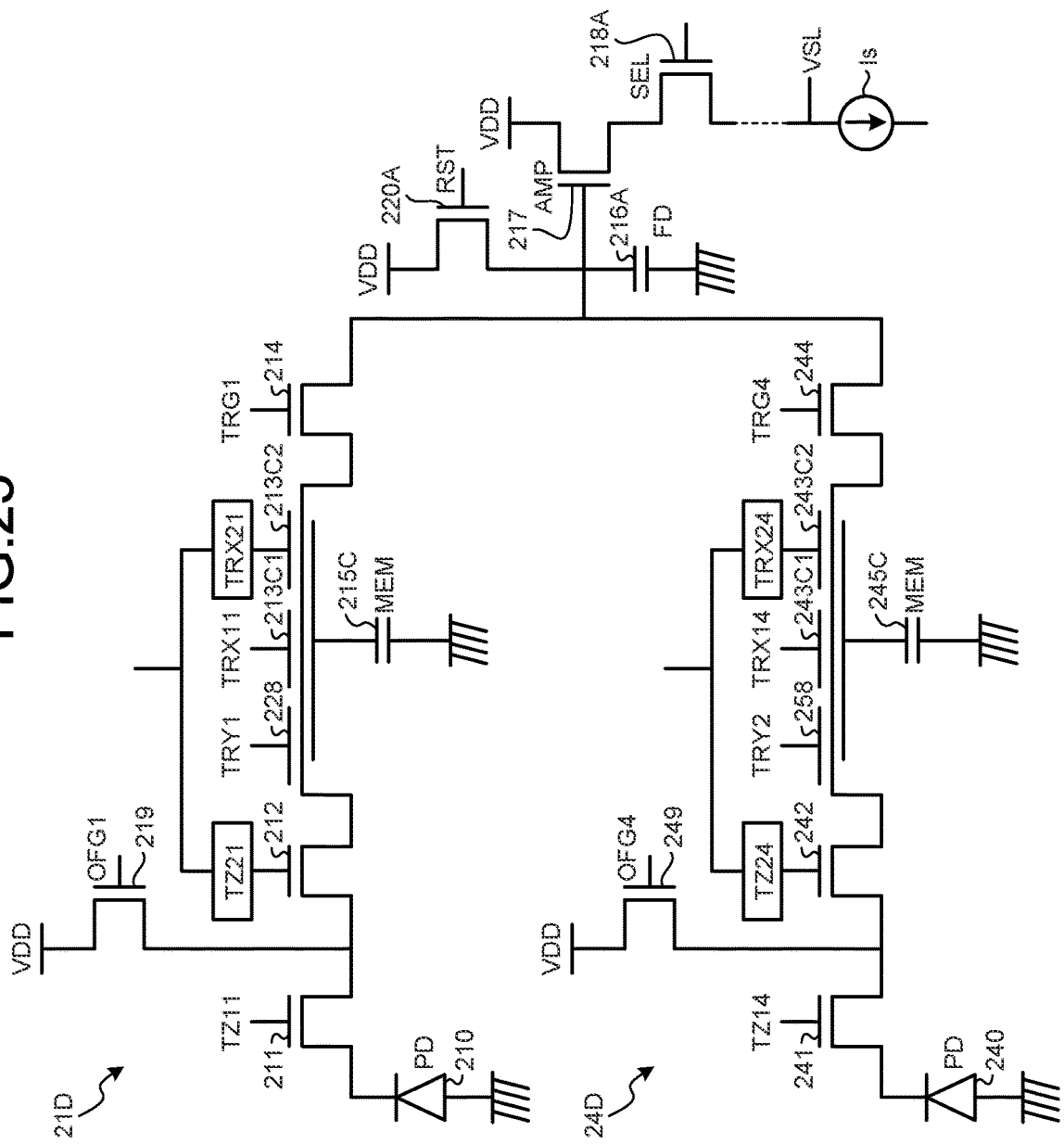
FIG. 25 is a diagram illustrating an example of a circuit configuration of the pixel.

FIG. 25 is a diagram illustrating an example of a circuit configuration of the pixel. A pixel 21D illustrated in FIG. 25 is different from the pixel 21C (FIG. 22) in that a transistor 228 is further provided, and the wiring of the drive signal TZ21 of the second transfer transistor 212 and the wiring of the drive signal TRX21 of the third transfer transistor 213C2 are shared. The transistor 228 is a backflow prevention transistor provided between the second transfer transistor 212 and the third transfer transistor 213. The drive signal applied to the transistor 228 is referred to as a drive signal TRY1 in the drawing. Similarly, a pixel 24D is different from the pixel 24C (FIG. 22) in that the pixel 24D includes a transistor 258 and that the wiring of the drive signal TZ24 of the second transfer transistor 242 and the wiring of the drive signal TRX24 of the third transfer transistor 243C2 are shared. The drive signal applied to the transistor 258 is referred to as a drive signal TRY2 in the drawing.

Figure 26:
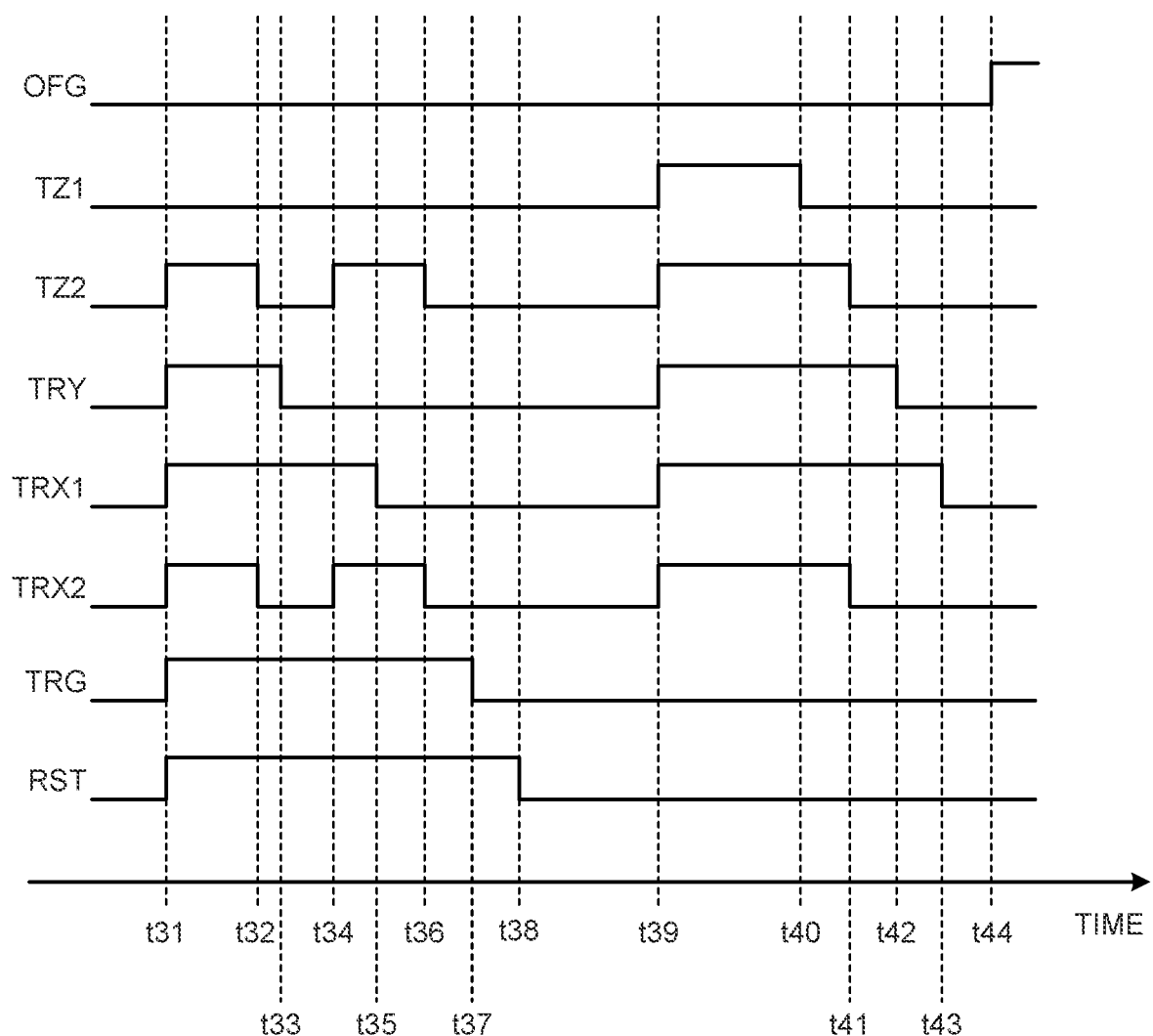
FIG. 26 is a diagram illustrating an example of a timing chart of drive signals.
Figure 27:
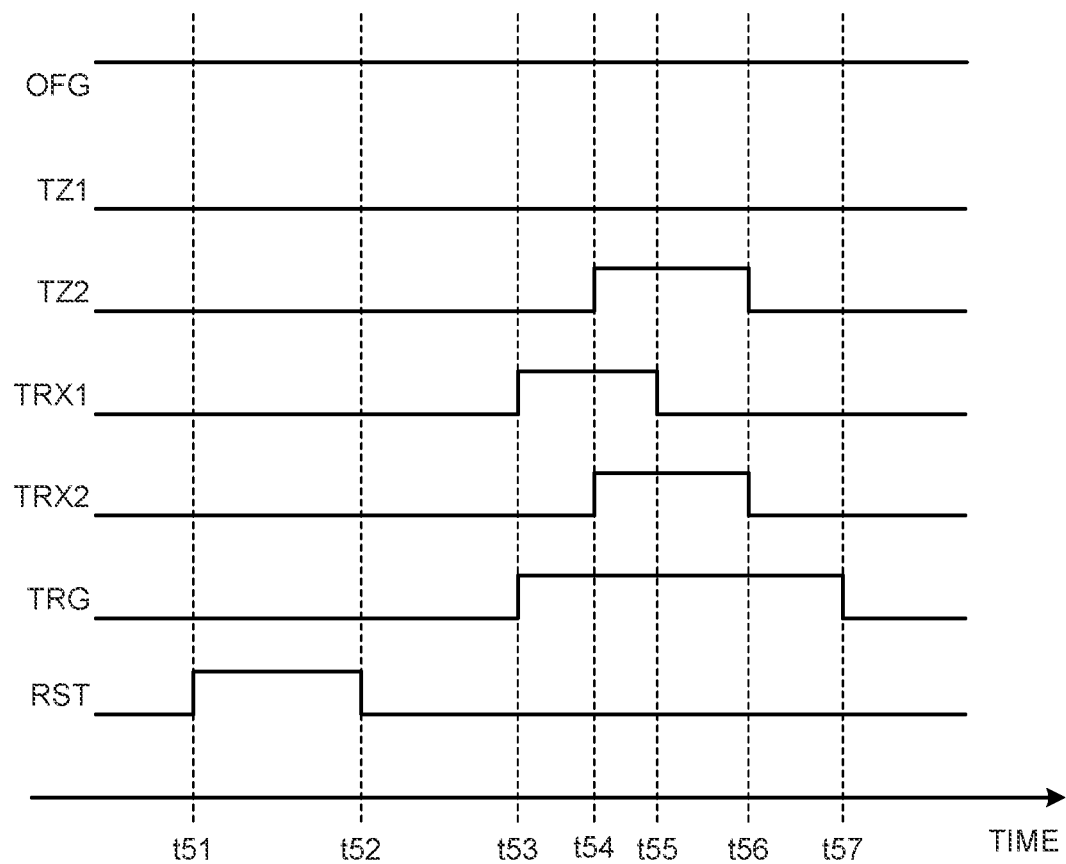
FIG. 27 is a diagram illustrating an example of the timing chart of the drive signals.

FIGS. 26 and 27 are diagrams illustrating examples of timing charts of the drive signals. FIG. 26 illustrates an example of the drive signals after the memory part is reset. A drive signal TRY is obtained by generalizing the drive signal TRY1 and the drive signal TRY2 described above.

At time t31, the drive signal TZ2 of the second transfer transistor 212, the drive signal TRY of the transistor 228, the drive signal TRX1 of the third transfer transistor 213C1, the drive signal TRX2 of the third transfer transistor 213C2, the drive signal TRG of the fourth transfer transistor 214, and the drive signal RST of the reset transistor 220 are turned on, and a reset of the MEM 215C starts. These drive signals are sequentially turned off at time t32, time t33, time t35, time t36, time t37, and time t38. Since the drive signal TZ2 and the drive signal TRX2 are the same signal, the drive signal TRX2 is also turned off at time t32 when the drive signal TZ2 is turned off. During a period from time t34 to time t36 before and after time t35 when the drive signal TRX1 is turned off, the drive signal TRX2 is turned on, and the drive signal TZ2 is also turned on. At time t33 prior to this period, the drive signal TRY is turned off, and backflow of charges is prevented.

At time t39, the drive signal TZ1 of the first transfer transistor 211, the drive signal TZ21 of the second transfer transistor 212, the drive signal TRY of the transistor 228, the drive signal TRX1 of the third transfer transistor 213C1, and the drive signal TRX2 of the third transfer transistor 213C2 are turned on, and the exposure ends. These drive signals are sequentially turned off from time t40 to time t43, and a charge accumulated in the PD 210 is transferred to the MEM 215C and held therein. At time t44, the drive signal OFG is turned on for the rolling readout operation.

FIG. 27 illustrates an example of the drive signal in the rolling readout operation. The drive signal RST is turned on at time t51 and turned off at time t52, whereby the FD 216 is reset. At time t53, the drive signal TRX1 and the drive signal TRG are turned on, and at time t54, the drive signal TRX2 is turned on. The drive signal TZ2 is turned on together. At subsequent time t55 to time t57, the drive signal TRX1, the drive signal TRX2, and the drive signal TRG are sequentially turned off. The drive signal TZ2 is also turned off together with the drive signal TRX2 at time t56. As a result, the charge retained in the MEM 215C is transferred to the FD 216A.

Although the example of sharing of the wiring of the drive signal TZ21 and the drive signal TRX21 has been described above, the wiring of the arbitrary drive signal TZi1 and the wiring of the drive signal TXj1 may be shared. For example, in the drive signal TZi1 and the drive signal TXj1, the wiring of the drive signal satisfying i=j is shared.

According to the fifth embodiment, since the number of wirings can be reduced by sharing the drive wirings of some of the transfer transistors, a degree of freedom in wiring layout can be improved, and improvement in yield by reducing a short circuit failure can also be expected. Further, since the number of drivers can be reduced, the circuit scale is also reduced.

6. Sixth Embodiment

In a sixth embodiment, a portion below the transfer transistor is also used as the PD.

Figure 28:
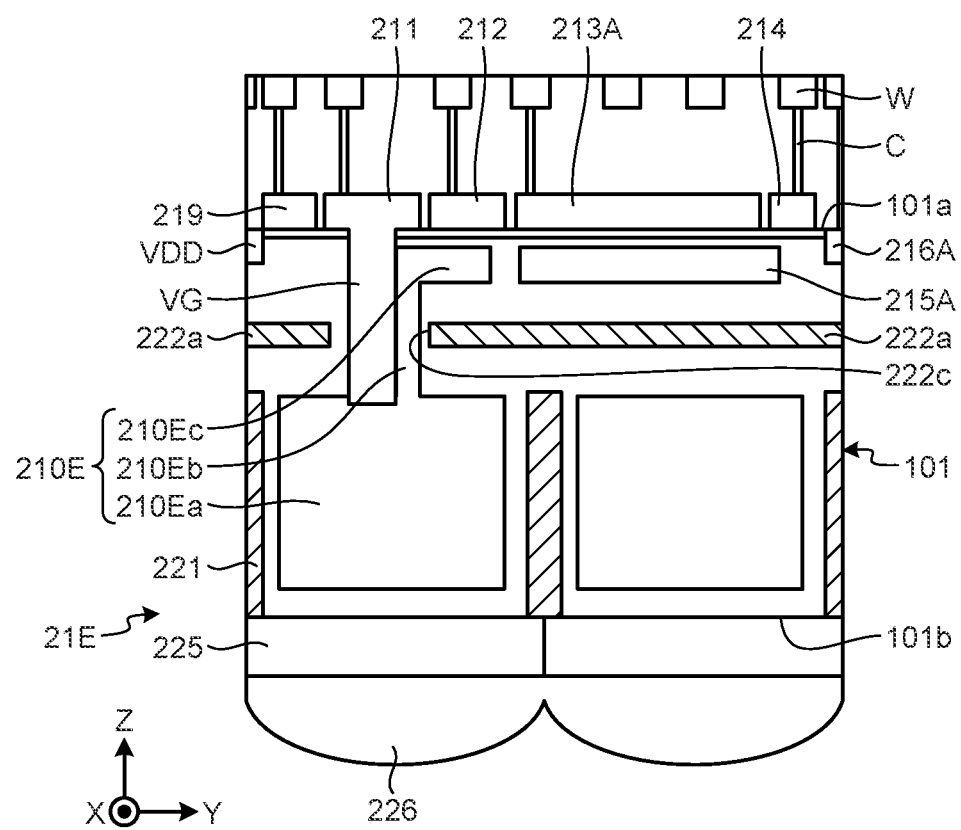
FIG. 28 is a diagram schematically illustrating an example of a layout of pixel components.

FIG. 28 is a diagram schematically illustrating a layout of pixel components. FIG. 28 schematically illustrates an example of the layout of the pixel components as viewed in the X-axis direction. In a pixel 21E illustrated, a PD 210E includes a main body 210Ea, an extending portion 210Eb (first extending portion), and an extending portion 210Ec (second extending portion). The main body 210Ea may be configured similarly to the PD 210 described above. The extending portion 210Eb extends in the Z axis direction from the main body 210Ea to a portion below the substrate front surface 100a. The extending portion 210Ec extends in the Y axis direction from a tip of the extending portion 210Eb. A tip of the extending portion 210Ec reaches a portion below the second transfer transistor 212. When a charge overflows from the main body 210Ea, the overflowed charge is accumulated in the extending portion 210Eb and the extending portion 210Ec.

Figure 29:
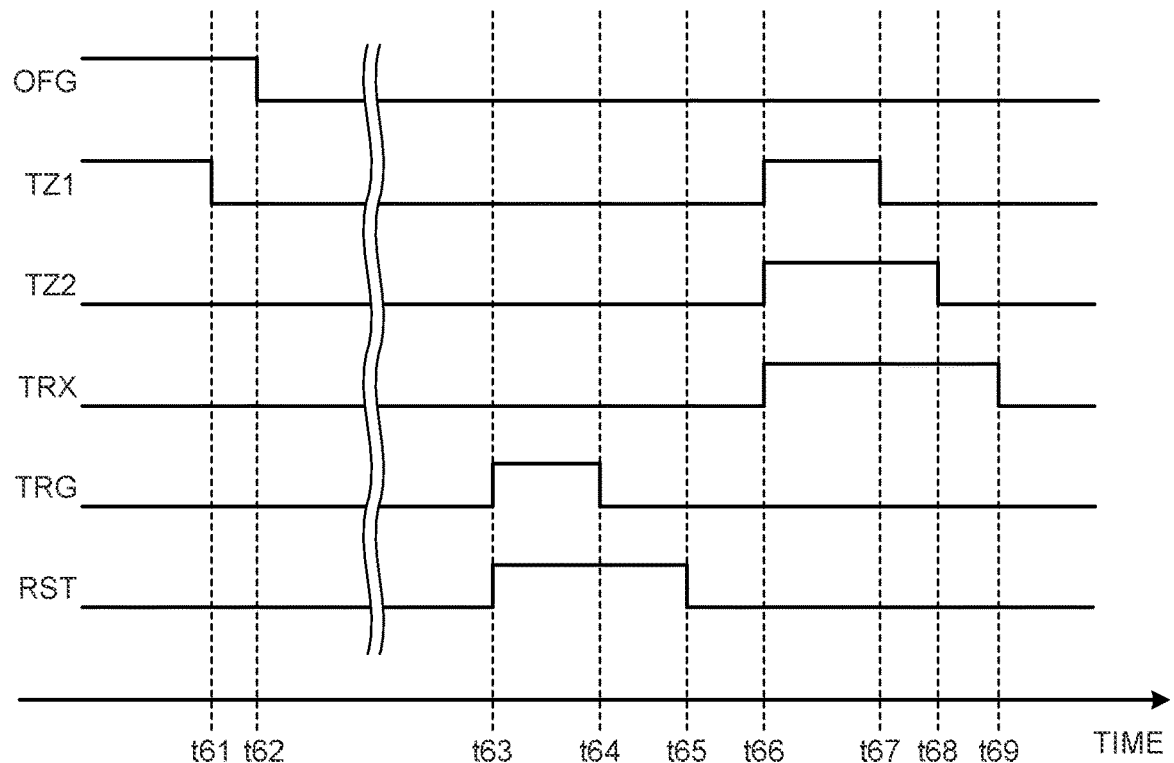
FIG. 29 is a diagram illustrating an example of a timing chart of a drive signal.
Figure 30:
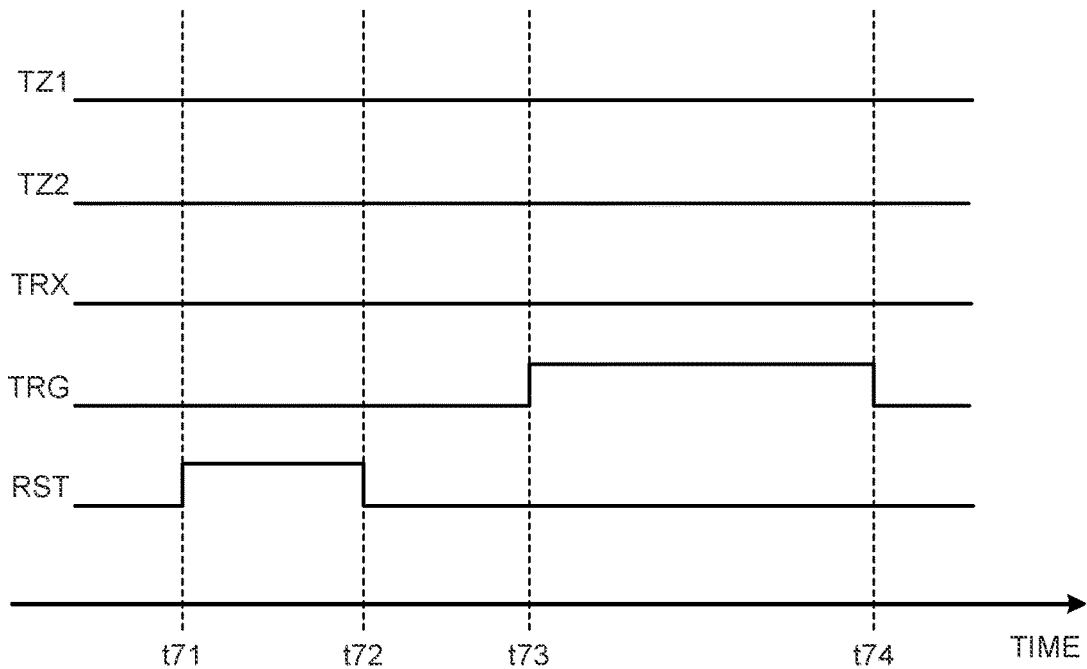
FIG. 30 is a diagram illustrating an example of the timing chart of drive signals.

FIGS. 29 and 30 are diagrams illustrating examples of timing charts of drive signals. FIG. 29 illustrates an example of the drive signals in the global transfer operation. Initially, the drive signal TZ1 and the drive signal OFG are in an on state, and the PD 210E including the portion below the second transfer transistor 212 is depleted. At time t61, the drive signal TZ1 is turned off, and exposure starts. At subsequent t62, the drive signal OFG is turned off.

The drive signal TRG and the drive signal RST are turned on at time t63, and are sequentially turned off at time t63 and time t64. As a result, the MEM 215A is reset. At this point, the drive signal TRX and the drive signal TZ1 remain off. By not turning on the drive signal TRX and the drive signal TZ1, charges accumulated in the portion below the first transfer transistor 211 and the second transfer transistor 212, i.e., the extending portion 210Eb and the extending portion 210Ec of the PD 210E, are not reset.

The drive signal TZ1, the drive signal TZ2, and the drive signal TRX are turned on at time t66 and sequentially turned off from time t67 to time t69. As a result, together with the charges accumulated in the main body 210Ea of the PD 210E, the charges accumulated in the extending portion 210Eb and the extending portion 210Ec are also transferred to and held in the MEM 215A.

FIG. 30 illustrates an example of the drive signals in the rolling readout operation. From time t71 to time t74, similarly to the time t21 to time t24 in FIG. 9 described above, the FD 216A is reset by turning on and off the drive signal RST, and charges retained in the MEM 215A are transferred to the FD 216A by turning on and off the drive signal TRG, and serve as the basis of the pixel signal.

Figure 31:
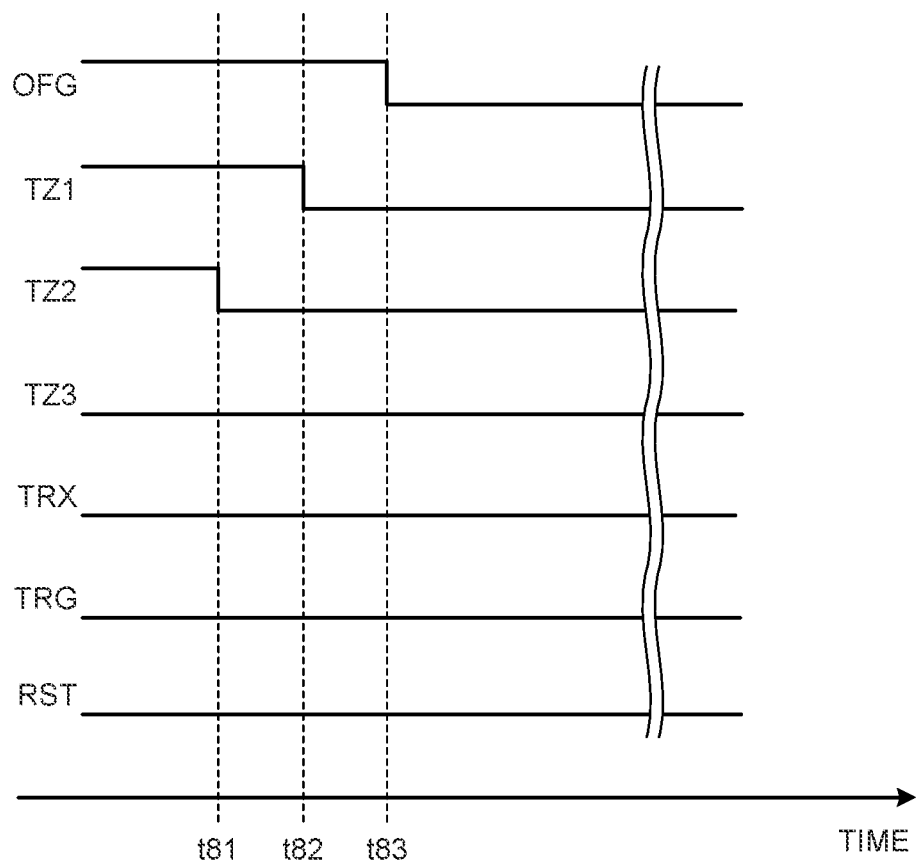
FIG. 31 is a diagram illustrating an example of the timing chart of the drive signal.

Although the example describes the case where the portion below the two transfer transistors, i.e., the first transfer transistor 211 and the second transfer transistor 212, are used as the PD, the portion below the n number (n is an integer of 3 or more) of transfer transistors may be used as the PD. In the case of n=3, the drive signal TZ3 is also present as illustrated in FIG. 31. From time t81 to time t83 before the memory part is reset, not only the drive signal OFG and the drive signal TZ1 but also the drive signal TZ2 is turned off. As a result, the portion below each of the transfer transistors is depleted and used as a PD.

According to the sixth embodiment, since the portion below the transfer transistors can also be used as the PD, saturation characteristics of the PD (PDQs) can be improved.

7. Seventh Embodiment

In a seventh embodiment, a portion below the transfer transistor is used as a second memory part.

Figure 32:
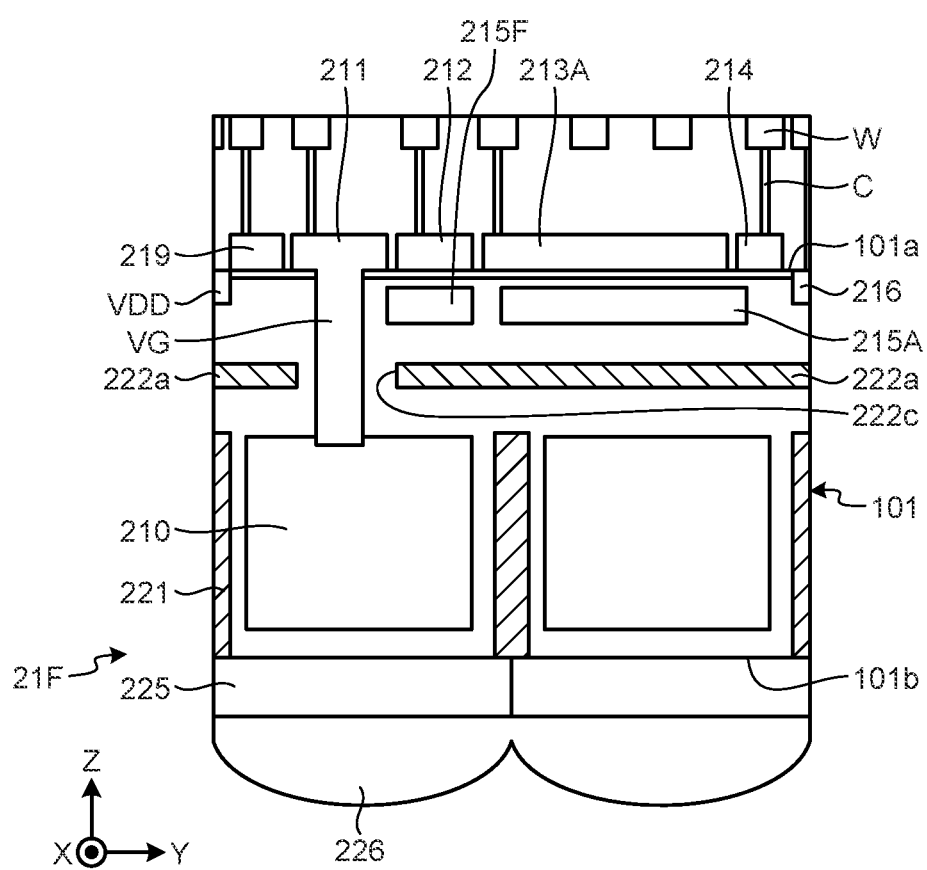
FIG. 32 is a diagram schematically illustrating an example of a layout of pixel components.

FIG. 32 is a diagram schematically illustrating a layout of pixel components. FIG. 32 schematically illustrates an example of the layout of the pixel components as viewed in the X-axis direction. In a pixel 21F illustrated, an MEM 215F is provided below the first transfer transistor 211 and the second transfer transistor 212. The MEM 215F is a second memory part that is connected to the PD 210 via the first transfer transistor 211 and the second transfer transistor 212, and holds charges transferred from the PD 210. The MEM 215F is formed, for example, as an n-type impurity region under the second transfer transistor 212. The MEM 215F is provided closer to the PD 210 than the MEM 215A within a range of acceptable PLS. The charge overflowing in one of the MEM 215A and the MEM 215F is accumulated in the other.

Figure 33:
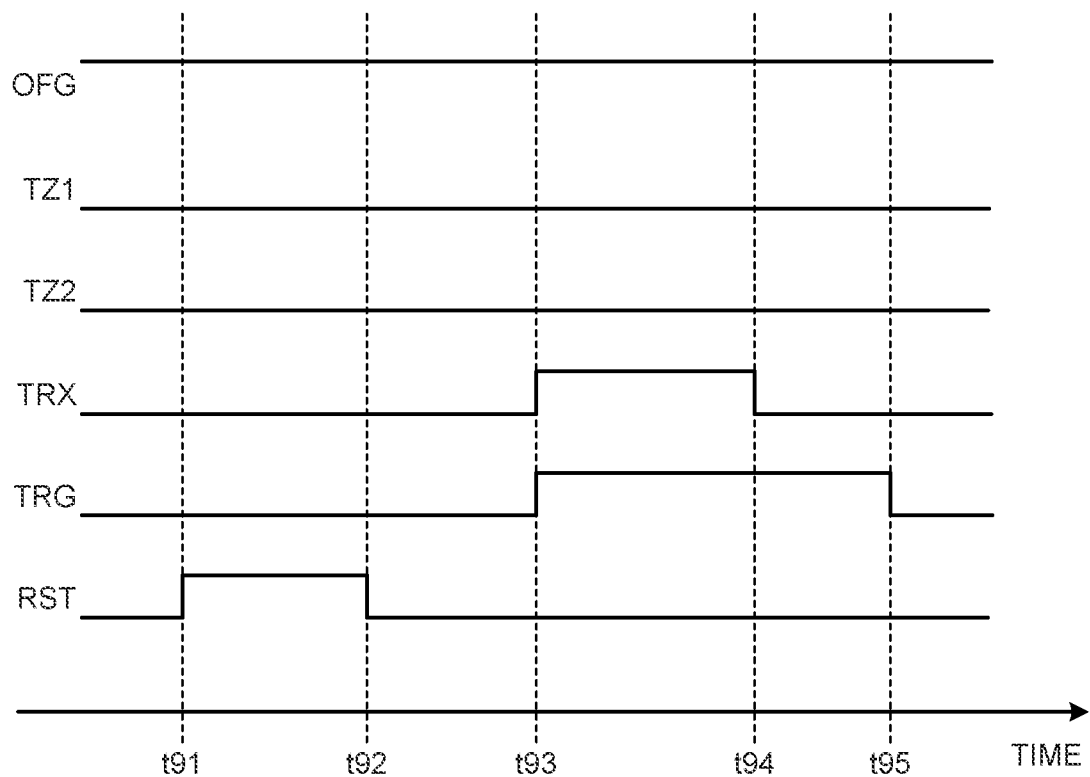
FIG. 33 is a diagram illustrating an example of a timing chart of drive signals.

FIG. 33 is a diagram illustrating an example of a timing chart of the drive signals. FIG. 33 illustrates an example of the drive signals in the rolling readout operation. The drive signal RST is turned on at time t91 and turned off at time t92. As a result, the FD 216A is reset.

The drive signal TRX and the drive signal TRG are turned on at time t93, and are sequentially turned off at time t94 and time t95. By applying not only the drive signal TRG but also the drive signal TRX, the charge retained in the MEM 215F is transferred to the FD 216 in addition to the charge retained in the MEM 215A.

Although the example describes the case where the portion below the two transfer transistors, i.e., the first transfer transistor 211 and the second transfer transistor 212, is used as the second memory part, a portion below the n number (n is an integer of 3 or more) of transfer transistors may be used as the second memory part. In this case, in the global transfer operation, the gates of the n number of transfer transistors are turned on to transfer the charges.

According to the seventh embodiment, since the MEM 215F is provided, saturation characteristics of the memory part can be improved as compared with the case where only the MEM 215A is provided.

8. Eighth Embodiment

In an eighth embodiment, the first transfer transistor does not include the gate VG extending in the Z-axis direction. Instead, the PD forms a potential gradient so that the charge accumulated in the PD is easily moved in the Z-axis direction.

Figure 34:
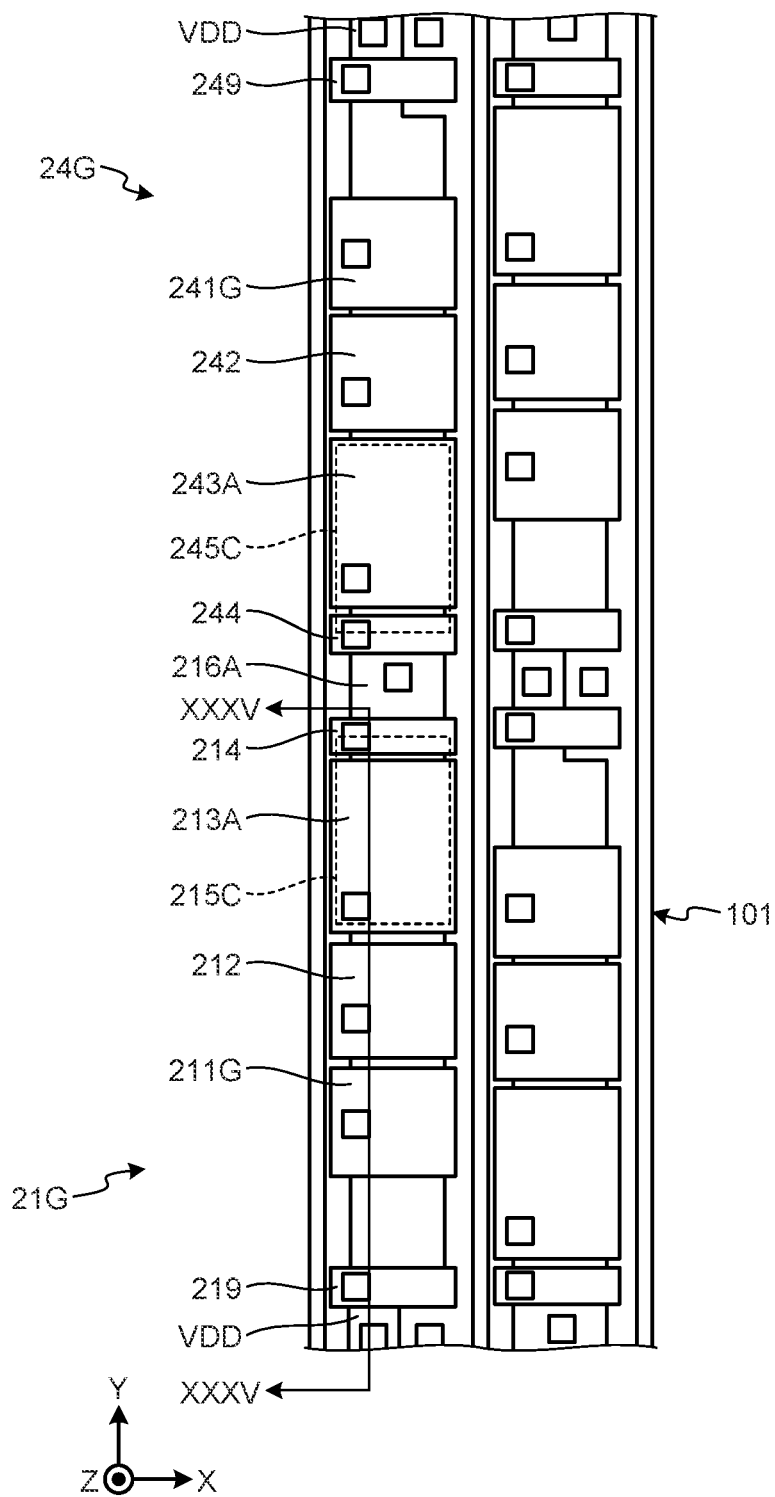
FIG. 34 is a diagram schematically illustrating an example of the layout of pixel components.
Figure 35:
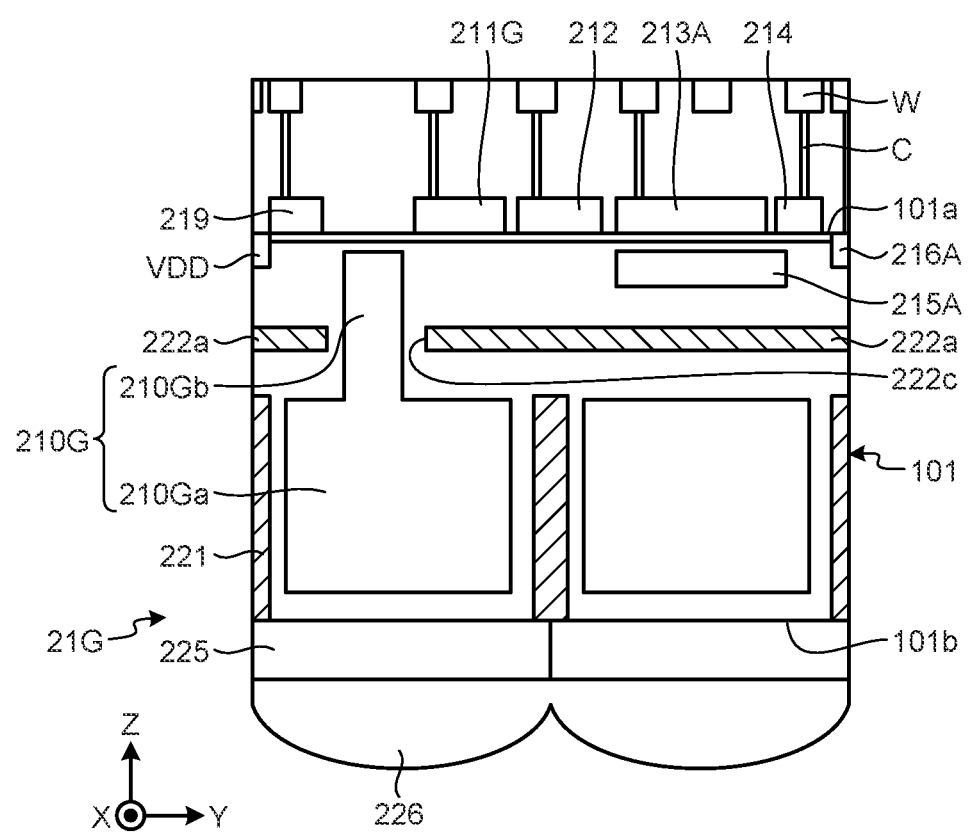
FIG. 35 is a diagram schematically illustrating an example of the layout of the pixel components.

FIGS. 34 and 35 are diagrams schematically illustrating layouts of pixel components. FIG. 34 schematically illustrates an example of the layout of the pixel components as viewed in the Z-axis direction. FIG. 35 schematically illustrates an example of the layout of the pixel components as viewed approximately along line XXXV in FIG. 34 (viewed in the X-axis direction). Note that the layout of the PD is different from that of the first embodiment (FIG. 3) in that there is no portion corresponding to the gate VG. In a pixel 21G illustrated, a first transfer transistor 211G does not have the gate VG described above (FIGS. 5, 6, and the like), and has a gate only on the substrate front surface 101a. On the other hand, a PD 210G includes a main body 210Ga and an extending portion 210Gb. The main body 210Ga may have the same configuration as the PD 210 described above. The extending portion 210Gb extends from the main body 210Ga to a portion below the substrate front surface 101a through the opening 222c of the light shielding part 222. The PD 210G forms a potential gradient so that the charge moves toward the tip of the extending portion 210Gb. The potential gradient is given by, for example, a concentration gradient of an N-type impurity. The charge moved to the tip of the extending portion 210Gb due to the potential gradient is transferred to the MEM 215A via the first transfer transistor 211G, the second transfer transistor 212, and a third transfer transistor 213A.

According to the eighth embodiment, since the first transfer transistor 211G does not have the gate VG, an effective distance between the PD 210G and the MEM 215A can be shortened. Therefore, the MEM 215A can be arranged away from the opening 222c with a smaller number of transfer gates, and thus deterioration of PLS can be suppressed.

9. Application Example

The solid-state imaging device according to each of the above-described embodiments is used by being mounted on, for example, an electronic apparatus. The electronic apparatus will be described with reference to FIG. 36.

Figure 36:
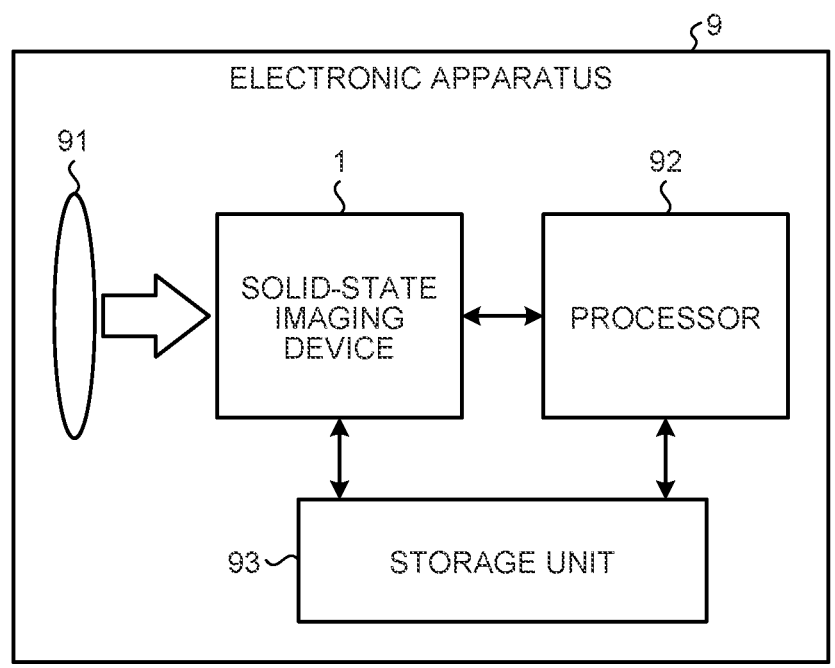
FIG. 36 is a diagram illustrating an example of a schematic configuration of an electronic apparatus.

FIG. 36 is a diagram illustrating an example of a schematic configuration of the electronic apparatus. An electronic apparatus 9 exemplified is a camera. The electronic apparatus 9 includes an imaging lens 91, the solid-state imaging device 1, a processor 92, and a storage unit 93.

The imaging lens 91 condenses incident light and forms an image thereof on the solid-state imaging device 1. However, an optical system other than the lens may be used. As described above, the solid-state imaging device 1 converts (photoelectrically converts) light entering a light receiving surface into an electric signal and generates an image signal (image data). The processor 92 controls the solid-state imaging device 1. For example, the processor 92 processes the image signal generated by the solid-state imaging device 1. In addition, the processor 92 executes various processes necessary for the electronic apparatus 9. In a case where the electronic apparatus 9 is a camera as described above, the processor 92 may execute processes such as auto exposure (AE) and auto focus (AF). The storage unit 93 stores the image signal generated by the solid-state imaging device 1. In addition, the storage unit 93 stores various pieces of data necessary for the processes executed by the processor 92.

10. Effects

For example, the solid-state imaging device 1 described above is specified as follows. As described with reference to FIGS. 1 to 14 and the like, the solid-state imaging device 1 is provided with the pixel array 2 including the plurality of pixels 20. The pixel 21 will be described as an example of each of the plurality of pixels 20. The pixel 21 includes the PD 210, the MEM 215, the first transfer transistor 211, the second transfer transistor 212, the third transfer transistor 213, the FD 216, and the light shielding part 222. The PD 210 is a photoelectric conversion part embedded away from the substrate front surface 100a of the semiconductor substrate 100. The MEM 215 is the memory part that holds the charge generated by the PD 210. The first transfer transistor 211, the second transfer transistor 212, and the third transfer transistor 213 are the transfer transistors connected in series between the PD 210 and the MEM 215. The FD 216 is the accumulation part that accumulates the charge transferred from the MEM 215. The light shielding part 222 covers a portion of the MEM 215 facing the substrate rear surface 101b side of the semiconductor substrate 100, and has the opening 222c between the PD 210 and the substrate front surface 100a. The first transfer transistor 211 may be provided on the substrate front surface 100a side of the semiconductor substrate 100 with respect to the PD 210. The second transfer transistor 212 may be provided side by side with the first transfer transistor 211 in the substrate surface direction (e.g., Y-axis direction) of the semiconductor substrate 100. The third transfer transistor 213 may be provided side by side with the second transfer transistor 212 in the substrate surface direction.

According to the solid-state imaging device 1 described above, the pixel 21 includes three transfer transistors, i.e., the first transfer transistor 211, the second transfer transistor 212, and the third transfer transistor 213, provided from the PD 210 to the MEM 215. Therefore, for example, as compared with a case where only two transfer transistors are provided, it is possible to arrange the MEM 215 away from the opening 222c while securing the potential gradient of the transfer transistors from the PD 210 to the MEM 215. As the MEM 215 is arranged away from the opening 222c, leakage of light to the MEM 215 through the opening 222c can be suppressed, and thus deterioration of the PLS can be suppressed.

As described with reference to FIGS. 15 to 18 and the like, the solid-state imaging device 1 may further include the pixel transistors (e.g., the selection transistor 218A and the reset transistor 220A) that output voltages according to the charge accumulated in the FD 216, and the pixel transistors may be provided in the semiconductor substrate 102 different from the semiconductor substrate 101. Accordingly, the area of the MEM 215A provided in the semiconductor substrate 101 can be increased.

As described with reference to FIGS. 19 to 21 and the like, the plurality of second transfer transistors such as the second transfer transistor 212B1 and the second transfer transistor 212B2 may be provided. Accordingly, the MEM 215A can be further arranged away from the opening 222c. Therefore, the effect of suppressing the deterioration of PLS can be further enhanced.

As described with reference to FIGS. 22 to 24 and the like, the plurality of third transfer transistors such as the third transfer transistor 213C1 and the third transfer transistor 213C2 may be provided. Accordingly, the MEM 215C can be arranged further away from the opening 222c. Therefore, the effect of suppressing the deterioration of PLS can be further enhanced. In addition, saturation characteristics of the MEM 215C can be improved by increasing the number of transistors provided (multistage gate) with respect to the MEM 215C.

As described with reference to FIGS. 25 to 27 and the like, for example, the second transfer transistor 212 and the third transfer transistor 213C2 may be connected to the common drive signal line. Since some transfer transistors share the drive wiring, the number of wirings can be reduced. As a result, the degree of freedom in wiring layout can be improved, and an improvement in yield by reducing short circuit failures can also be expected. Further, since the number of drivers can be reduced, the circuit scale is also reduced.

As described with reference to FIGS. 28 to 31 and the like, the PD 210E may extend to a portion below the substrate front surface 101a through the opening 222c in the light shielding part 222, and further extend in the Y-axis direction. In this case, since the portion below the first transfer transistor 211 and the second transfer transistor 212 can also be used as the PD, saturation characteristics of the PD (PDQs) can be improved.

As described with reference to FIGS. 32, 33, and the like, the solid-state imaging device 1 may further include the MEM 215F (second memory part) that is connected to the PD 210 via the first transfer transistor 211 and the second transfer transistor 212, and holds the charge transferred from the PD 210. Since the MEM 215F is provided, the saturation characteristics of the memory part can be improved as compared with the case where only the MEM 215A is provided.

As described with reference to FIGS. 5 and 6 and the like, the first transfer transistor 211 may have the gate VG extending to the PD 210 through the opening 222c of the light shielding part 222. As a result, the charge accumulated in the PD 210 is easily transferred by the first transfer transistor 211.

As described with reference to FIGS. 34, 35, and the like, the PD 210G may extend to the portion below the substrate front surface 101a through the opening 222c in the light shielding part 222, and may form a potential gradient. In this case, since the first transfer transistor 211G may not have the gate VG, the effective distance between the PD 210G and the MEM 215A can be shortened. Therefore, the MEM 215A can be arranged away from the opening 222c with a smaller number of transfer gates, and thus deterioration of PLS can be suppressed.

The solid-state imaging device 1 may be a backside-illuminated solid-state imaging device in which light from the subject enters the substrate rear surface 100b of the semiconductor substrate 100. As a result, the light from the subject can be efficiently converted into charges.

The pixel driving method described with reference to FIG. 14 and the like is also one aspect of the present disclosure. More specifically, in the pixel driving method, the first transfer transistor 211, the second transfer transistor 212, and the third transfer transistor 213 are driven such that charges accumulated in the PD 210 are transferred to the MEM 215 via the first transfer transistor 211, the second transfer transistor 212, and the third transfer transistor 213 (Step S5). Also by this driving method, similarly to the solid-state imaging device 1 described above, deterioration of PLS can be suppressed.

The electronic apparatus 9 described with reference to FIG. 36 and the like is also one aspect of the present disclosure. More specifically, according to the electronic apparatus 9, the deterioration of PLS can be suppressed by installing the solid-state imaging device 1.

Note that the effects described in the present disclosure are merely examples and are not limited to the subject matter disclosed. There may be other effects.

The technical scope of the present disclosure is not limited to the above-described embodiments, and various modifications can be made without departing from the gist of the present disclosure. In addition, components of different embodiments and modifications may be appropriately combined.

Note that the effects of each embodiment described in the present specification are merely examples and not limited thereto, and other effects may be provided.

Note that the present technology can also have the following configurations.

(1)
A solid-state imaging device comprising a pixel array having a plurality of pixels, each of the plurality of pixels including:
   a photoelectric conversion part embedded away from a substrate front surface of a semiconductor substrate,
   a memory part that holds a charge generated in the photoelectric conversion part,
   a first transfer transistor, a second transfer transistor, and a third transfer transistor connected in series between the photoelectric conversion part and the memory part,
   an accumulation part that accumulates the charge transferred from the memory part, and
   a light shielding part that covers a portion of the memory part facing a substrate rear surface side of the semiconductor substrate, and has an opening between the photoelectric conversion part and the substrate front surface.

(2)
The solid-state imaging device according to (1), wherein
   the first transfer transistor is provided, with respect to the photoelectric conversion part, on a substrate front surface side of the semiconductor substrate,
   the second transfer transistor is provided side by side with the first transfer transistor in a substrate surface direction of the semiconductor substrate, and
   the third transfer transistor is provided side by side with the second transfer transistor in the substrate surface direction.

(3)
The solid-state imaging device according to (1) or (2), further comprising a pixel transistor that outputs a voltage corresponding to the charge accumulated in the accumulation part, wherein
   the pixel transistor is provided on a different semiconductor substrate from the semiconductor substrate.

(4)
The solid-state imaging device according to any one of (1) to (3), wherein
   the second transfer transistor is a plurality of second transfer transistors.

(5)
The solid-state imaging device according to any one of (1) to (4), wherein
   the third transfer transistor is a plurality of third transfer transistors.

(6)
The solid-state imaging device according to any one of (1) to (5), wherein
   the second transfer transistor is a plurality of second transfer transistors,
   the third transfer transistor is a plurality of third transfer transistors, and
   corresponding transfer transistors in the plurality of second transfer transistors and the plurality of third transfer transistors are connected to a common drive signal line.

(7)
The solid-state imaging device according to any one of (1) to (6), wherein
   the photoelectric conversion part extends to a portion below the substrate front surface of the semiconductor substrate through the opening in the light shielding part, and further extends in a direction from the first transfer transistor to the second transfer transistor.

(8)
The solid-state imaging device according to any one of (1) to (7), further comprising:
   a second memory part that is connected to the photoelectric conversion part via the first transfer transistor and the second transfer transistor, and holds the charge transferred from the photoelectric conversion part.

(9)
The solid-state imaging device according to any one of (1) to (8), wherein
   the first transfer transistor has a gate extending to the photoelectric conversion part through the opening in the light shielding part.

(10)
The solid-state imaging device according to any one of (1) to (9), wherein
   the photoelectric conversion part extends to a portion below the substrate front surface of the semiconductor substrate through the opening in the light shielding part, and forms a potential gradient.

(11)
The solid-state imaging device according to any one of (1) to (10), wherein
   light from a subject enters a substrate rear surface of the semiconductor substrate.

(12)
A pixel driving method of driving a plurality of pixels, each of the plurality of pixels including:
   a photoelectric conversion part embedded away from a substrate front surface of a semiconductor substrate,
   a memory part that holds a charge generated in the photoelectric conversion part;
   a first transfer transistor, a second transfer transistor, and a third transfer transistor connected in series between the photoelectric conversion part and the memory part,
   an accumulation part that accumulates the charge transferred from the memory part, and
   a light shielding part that covers a portion of the memory part facing a substrate rear surface side of the semiconductor substrate, and has an opening between the photoelectric conversion part and the substrate front surface, the pixel driving method comprising:
   driving the first transfer transistor, the second transfer transistor, and the third transfer transistor so as to transfer the charge accumulated in the photoelectric conversion part to the memory part via the first transfer transistor, the second transfer transistor, and the third transfer transistor.

(13)
An electronic apparatus equipped with a solid-state imaging device including a pixel array having a plurality of pixels, each of the plurality of pixels including:
   a photoelectric conversion part embedded away from a substrate front surface of a semiconductor substrate, a memory part that holds a charge generated in the photoelectric conversion part, a first transfer transistor, a second transfer transistor, and a third transfer transistor connected in series between the photoelectric conversion part and the memory part, an accumulation part that accumulates the charge transferred from the memory part, and a light shielding part that covers a portion of the memory part facing a substrate rear surface side of the semiconductor substrate, and has an opening between the photoelectric conversion part and the substrate front surface.

REFERENCE SIGNS LIST

1 SOLID-STATE IMAGING DEVICE
9 ELECTRONIC APPARATUS
20 PIXEL
21 PIXEL
24 PIXEL
100 SEMICONDUCTOR SUBSTRATE
100a SUBSTRATE FRONT SURFACE
100b SUBSTRATE REAR SURFACE
210 PD
211 FIRST TRANSFER TRANSISTOR
212 SECOND TRANSFER TRANSISTOR
213 THIRD TRANSFER TRANSISTOR
214 FOURTH TRANSFER TRANSISTOR
215 MEM
216 FD
217 AMPLIFICATION TRANSISTOR
218 SELECTION TRANSISTOR
219 DISCHARGE TRANSISTOR
220 RESET TRANSISTOR

The invention claimed is:

1. A solid-state imaging device comprising a pixel array having a plurality of pixels, each of the plurality of pixels comprising:
    a photoelectric conversion part embedded away from a substrate front surface of a semiconductor substrate;
    a memory part that holds a charge generated in the photoelectric conversion part;
    a first transfer transistor, a second transfer transistor, and a third transfer transistor connected in series between the photoelectric conversion part and the memory part;
    an accumulation part that accumulates the charge transferred from the memory part; and
    a light shielding part that covers a portion of the memory part facing a substrate rear surface side of the semiconductor substrate, and has an opening between the photoelectric conversion part and the substrate front surface,
    wherein the second transfer transistor is a plurality of second transfer transistors,
    wherein the third transfer transistor is a plurality of third transfer transistors, and
    wherein corresponding transfer transistors in the plurality of second transfer transistors and the plurality of third transfer transistors are connected to a common drive signal line.

2. The solid-state imaging device according to claim 1, wherein
    the first transfer transistor is provided, with respect to the photoelectric conversion part, on a substrate front surface side of the semiconductor substrate,
    the second transfer transistor is provided side by side with the first transfer transistor in a substrate surface direction of the semiconductor substrate, and
    the third transfer transistor is provided side by side with the second transfer transistor in the substrate surface direction.

3. The solid-state imaging device according to claim 1, further comprising a pixel transistor that outputs a voltage corresponding to the charge accumulated in the accumulation part, wherein
    the pixel transistor is provided on a different semiconductor substrate from the semiconductor substrate.

4. The solid-state imaging device according to claim 1, wherein
    the photoelectric conversion part extends to a portion below the substrate front surface of the semiconductor substrate through the opening in the light shielding part, and further extends in a direction from the first transfer transistor to the second transfer transistor.

5. The solid-state imaging device according to claim 1, further comprising:
    a second memory part that is connected to the photoelectric conversion part via the first transfer transistor and the second transfer transistor, and holds the charge transferred from the photoelectric conversion part.

6. The solid-state imaging device according to claim 1, wherein the first transfer transistor has a gate extending to the photoelectric conversion part through the opening in the light shielding part.

7. The solid-state imaging device according to claim 1, wherein the photoelectric conversion part extends to a portion below the substrate front surface of the semiconductor substrate through the opening in the light shielding part, and forms a potential gradient.

8. The solid-state imaging device according to claim 1, wherein light from a subject enters a substrate rear surface of the semiconductor substrate.

9. A pixel driving method of driving a plurality of pixels, each of the plurality of pixels comprising:
    a photoelectric conversion part embedded away from a substrate front surface of a semiconductor substrate;
    a memory part that holds a charge generated in the photoelectric conversion part;
    a first transfer transistor, a plurality of second transfer transistors, and a plurality of third transfer transistors connected in series between the photoelectric conversion part and the memory part;
    an accumulation part that accumulates the charge transferred from the memory part; and
    a light shielding part that covers a portion of the memory part facing a substrate rear surface side of the semiconductor substrate and has an opening between the photoelectric conversion part and the substrate front surface,
    wherein corresponding transfer transistors in the plurality of second transfer transistors and the plurality of third transfer transistors are connected to a common drive signal line,
    the pixel driving method comprising:
        driving the first transfer transistor, the plurality of second transfer transistors, and the plurality of third transfer transistors so as to transfer the charge accumulated in the photoelectric conversion part to the memory part via the first transfer transistor, the plurality of second transfer transistors, and the plurality of third transfer transistors.

10. An electronic apparatus equipped with a solid-state imaging device including a pixel array having a plurality of pixels, each of the plurality of pixels comprising:
- a photoelectric conversion part embedded away from a substrate front surface of a semiconductor substrate;
- a memory part that holds a charge generated in the photoelectric conversion part;
- a first transfer transistor, a second transfer transistor, and a third transfer transistor connected in series between the photoelectric conversion part and the memory part;
- an accumulation part that accumulates the charge transferred from the memory part; and
- a light shielding part that covers a portion of the memory part facing a substrate rear surface side of the semiconductor substrate, and has an opening between the photoelectric conversion part and the substrate front surface,
- wherein the second transfer transistor is a plurality of second transfer transistors,
- wherein the third transfer transistor is a plurality of third transfer transistors, and
- wherein corresponding transfer transistors in the plurality of second transfer transistors and the plurality of third transfer transistors are connected to a common drive signal line.

11. The electronic apparatus according to claim 10, wherein
- the first transfer transistor is provided, with respect to the photoelectric conversion part, on a substrate front surface side of the semiconductor substrate,
- the second transfer transistor is provided side by side with the first transfer transistor in a substrate surface direction of the semiconductor substrate, and
- the third transfer transistor is provided side by side with the second transfer transistor in the substrate surface direction.

12. The electronic apparatus according to claim 10, further comprising a pixel transistor that outputs a voltage corresponding to the charge accumulated in the accumulation part, wherein the pixel transistor is provided on a different semiconductor substrate from the semiconductor substrate.

13. The electronic apparatus according to claim 10, wherein
the photoelectric conversion part extends to a portion below the substrate front surface of the semiconductor substrate through the opening in the light shielding part, and further extends in a direction from the first transfer transistor to the second transfer transistor.

14. The electronic apparatus according to claim 10, further comprising:
a second memory part that is connected to the photoelectric conversion part via the first transfer transistor and the second transfer transistor, and holds the charge transferred from the photoelectric conversion part.

15. The electronic apparatus according to claim 10, wherein the first transfer transistor has a gate extending to the photoelectric conversion part through the opening in the light shielding part.

16. The electronic apparatus according to claim 10, wherein the photoelectric conversion part extends to a portion below the substrate front surface of the semiconductor substrate through the opening in the light shielding part and forms a potential gradient.

17. The electronic apparatus according to claim 10, wherein light from a subject enters a substrate rear surface of the semiconductor substrate.

18. The electronic apparatus according to claim 10, wherein an example of a material for the light shielding part is metal.

19. The electronic apparatus according to claim 10, wherein the light shielding part includes multiple light shielding portions.

20. The solid-state imaging device according to claim 8, wherein the light shielding part includes multiple light shielding portions.

* * * * *